United States Patent
Naito et al.

(10) Patent No.: US 11,646,354 B2
(45) Date of Patent: May 9, 2023

(54) SEMICONDUCTOR DEVICE AND SEMICONDUCTOR STORAGE DEVICE

(71) Applicant: KIOXIA CORPORATION, Tokyo (JP)

(72) Inventors: Shinya Naito, Toyota Aichi (JP); Keiji Hosotani, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 108 days.

(21) Appl. No.: 17/190,360

(22) Filed: Mar. 2, 2021

(65) Prior Publication Data
US 2022/0093764 A1 Mar. 24, 2022

(30) Foreign Application Priority Data
Sep. 23, 2020 (JP) ............... JP2020-158213

(51) Int. Cl.
| | | |
|---|---|---|
| *H01L 27/11556* | (2017.01) | |
| *H01L 29/423* | (2006.01) | |
| *H01L 27/11519* | (2017.01) | |
| *H01L 27/11524* | (2017.01) | |
| *H01L 27/11565* | (2017.01) | |

(Continued)

(52) U.S. Cl.
CPC .... *H01L 29/42328* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01); *H01L 29/40114* (2019.08); *H01L 29/40117* (2019.08); *H01L 29/42344* (2013.01); *H01L 29/66825* (2013.01); *H01L 29/66833* (2013.01); *H01L 29/788* (2013.01); *H01L 29/792* (2013.01)

(58) Field of Classification Search
CPC ......... H01L 29/42328; H01L 27/11519; H01L 27/11524; H01L 27/11556; H01L 27/11565; H01L 27/1157; H01L 27/11582; H01L 29/40114; H01L 29/40117; H01L 29/42344; H01L 29/66825; H01L 29/66833; H01L 29/788; H01L 29/792; H01L 27/11578
See application file for complete search history.

(56) References Cited

U.S. PATENT DOCUMENTS

| | | |
|---|---|---|
| 2013/0341703 A1 | 12/2013 | Shinohara et al. |
| 2017/0040381 A1 | 2/2017 | Chen et al. |

(Continued)

FOREIGN PATENT DOCUMENTS

JP 2020-092141 A 6/2020

*Primary Examiner* — David Vu
(74) *Attorney, Agent, or Firm* — Kim & Stewart LLP

(57) ABSTRACT

A semiconductor device includes first and second gate electrodes, a semiconductor layer between the first and second gate electrodes and extending along a first direction, a first gate insulating layer between the first gate electrode and the semiconductor layer, a second gate insulating layer between the second gate electrode and the semiconductor layer, a first insulating layer including a first region adjacent to the first gate electrode in the first direction and contacting the semiconductor layer, and a second insulating layer extending including a second region adjacent to the second gate electrode in the first direction and contacting the semiconductor layer. An interface between the first region and the semiconductor layer in a direction crossing the first direction is adjacent to the first gate electrode in the first direction.

9 Claims, 26 Drawing Sheets

(51) Int. Cl.
*H01L 27/1157* (2017.01)
*H01L 29/792* (2006.01)
*H01L 21/28* (2006.01)
*H01L 29/66* (2006.01)
*H01L 29/788* (2006.01)
*H01L 27/11582* (2017.01)

(56) References Cited

U.S. PATENT DOCUMENTS

2020/0176033 A1 6/2020 Hosotani et al.
2020/0286828 A1 9/2020 Hosotani et al.

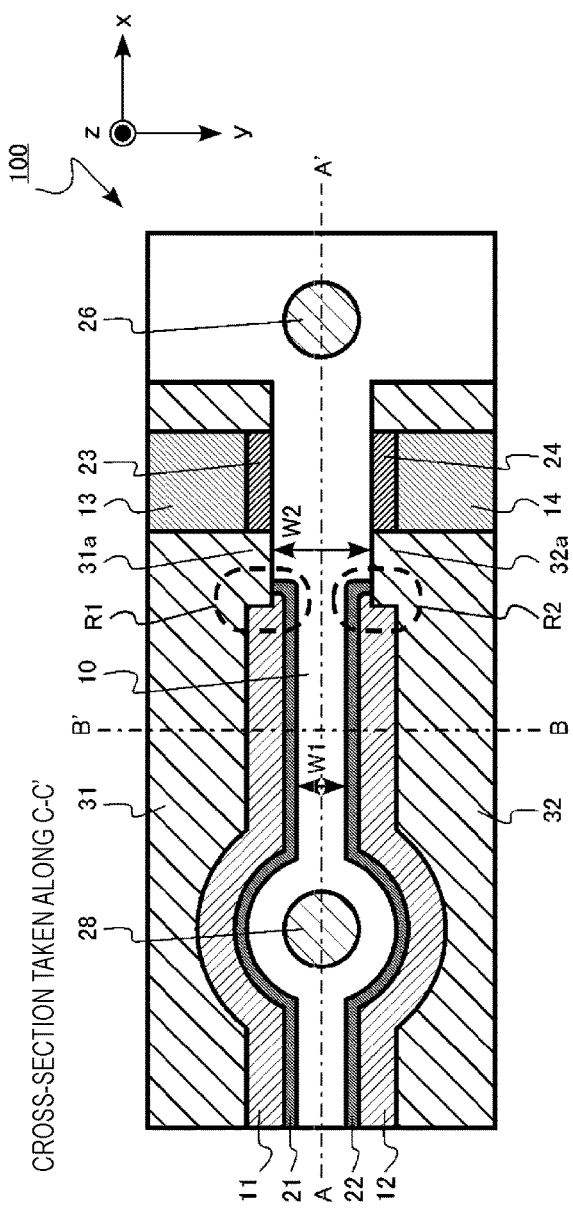
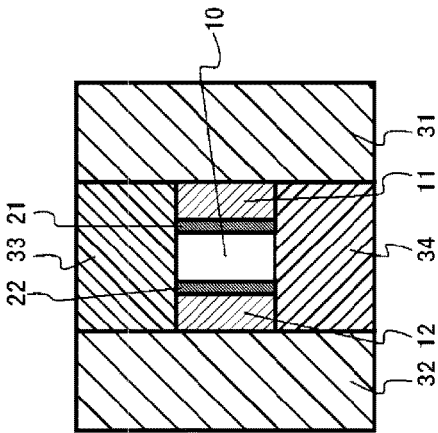

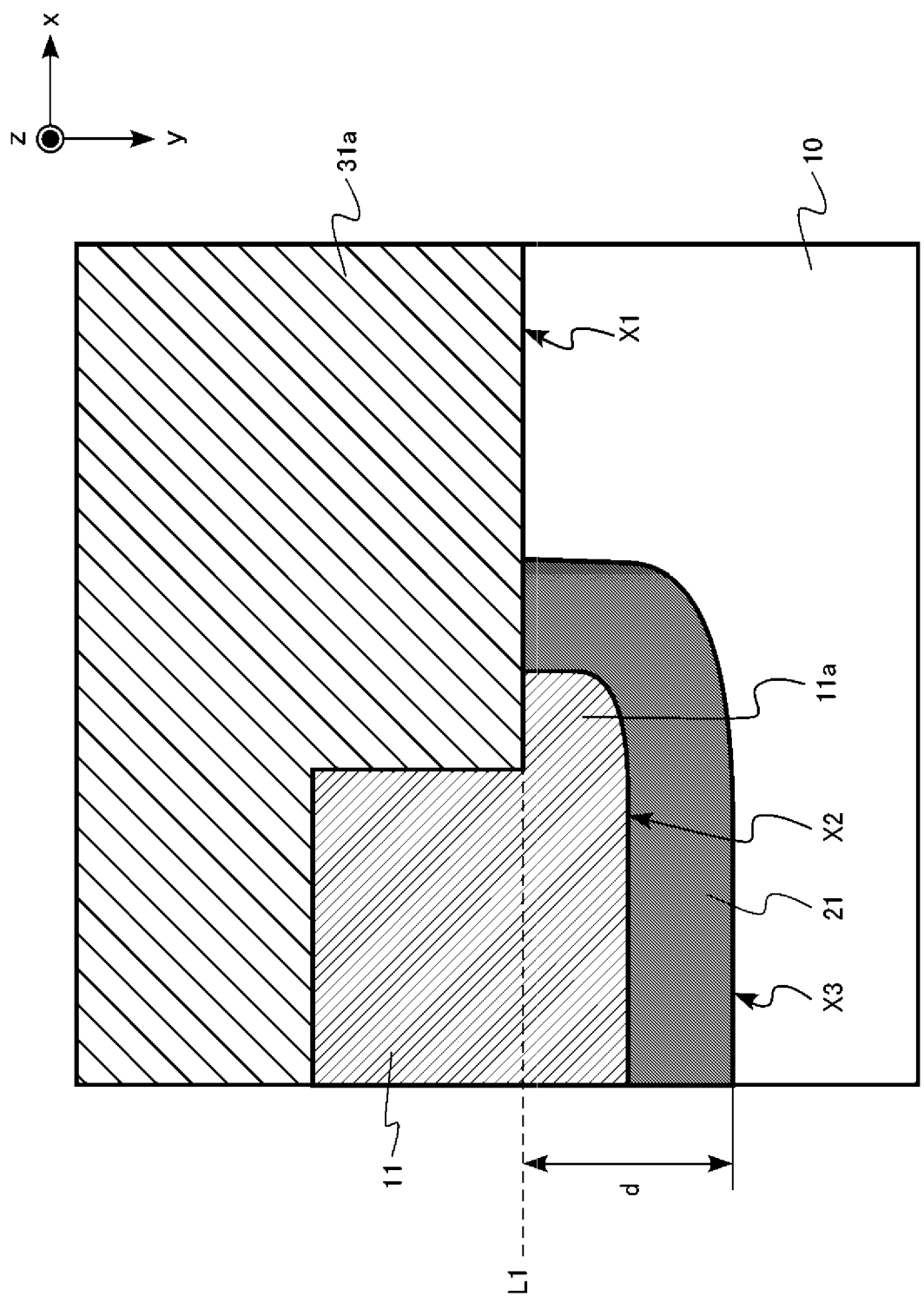

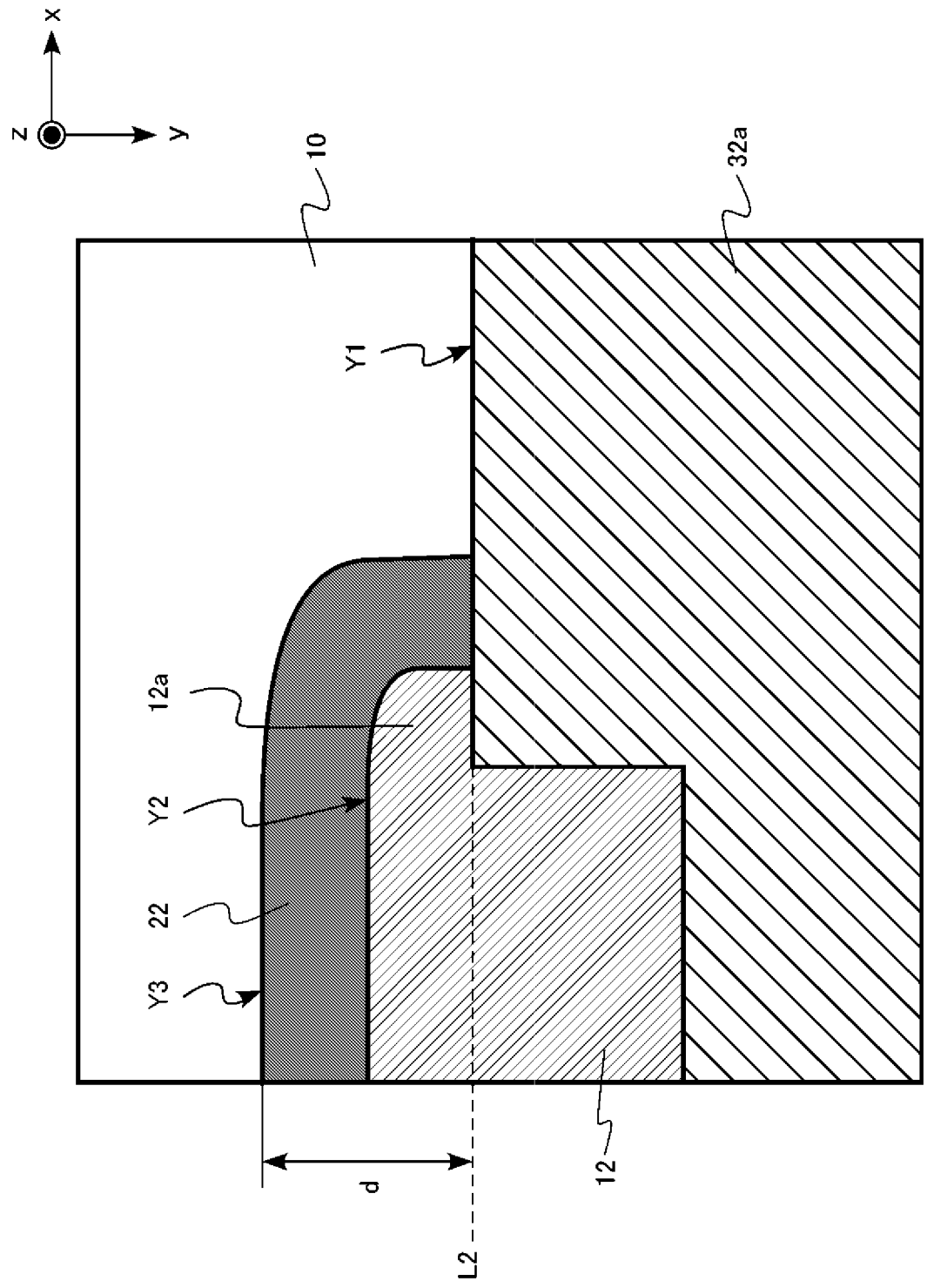

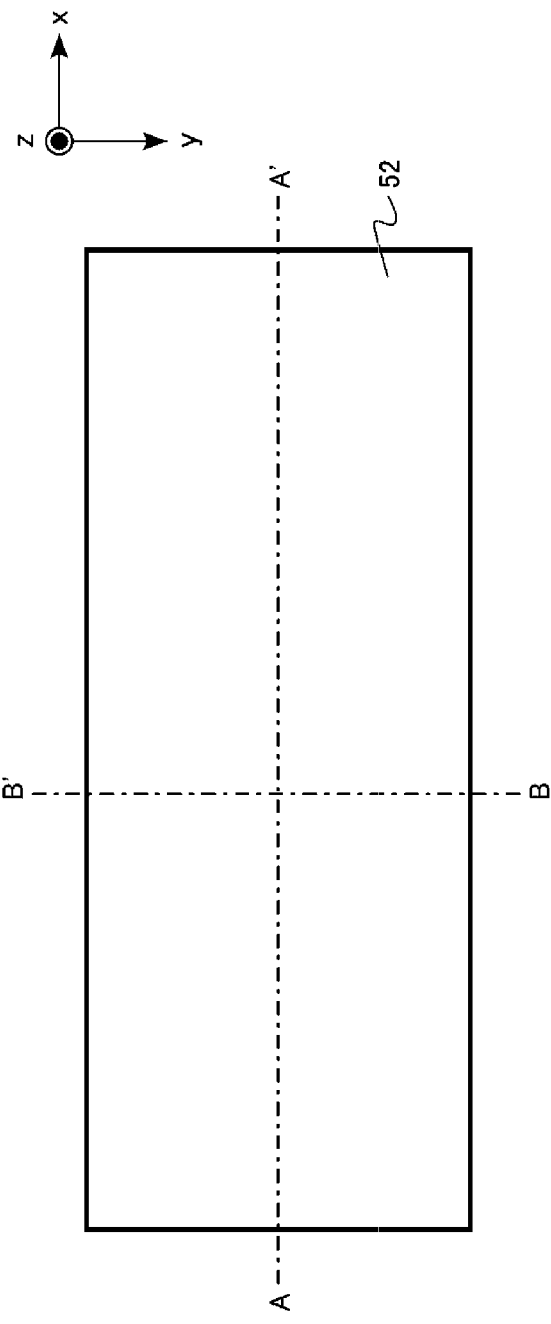
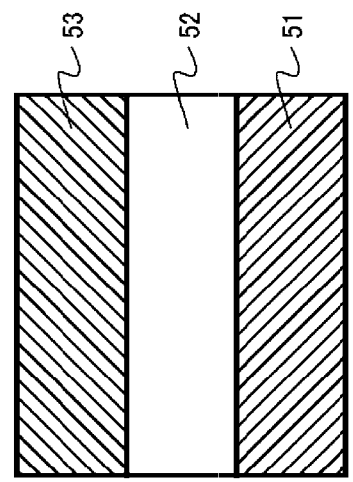
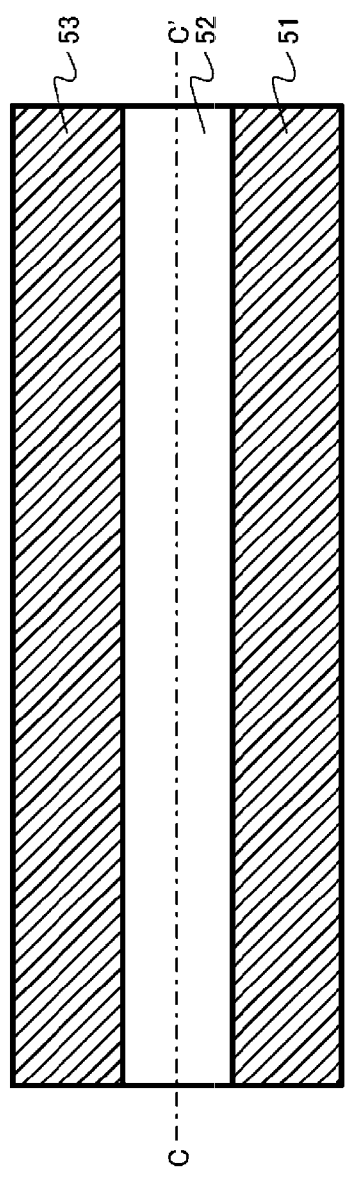

CROSS-SECTION TAKEN ALONG C-C'

CROSS-SECTION TAKEN ALONG A-A'

CROSS-SECTION TAKEN ALONG B-B'

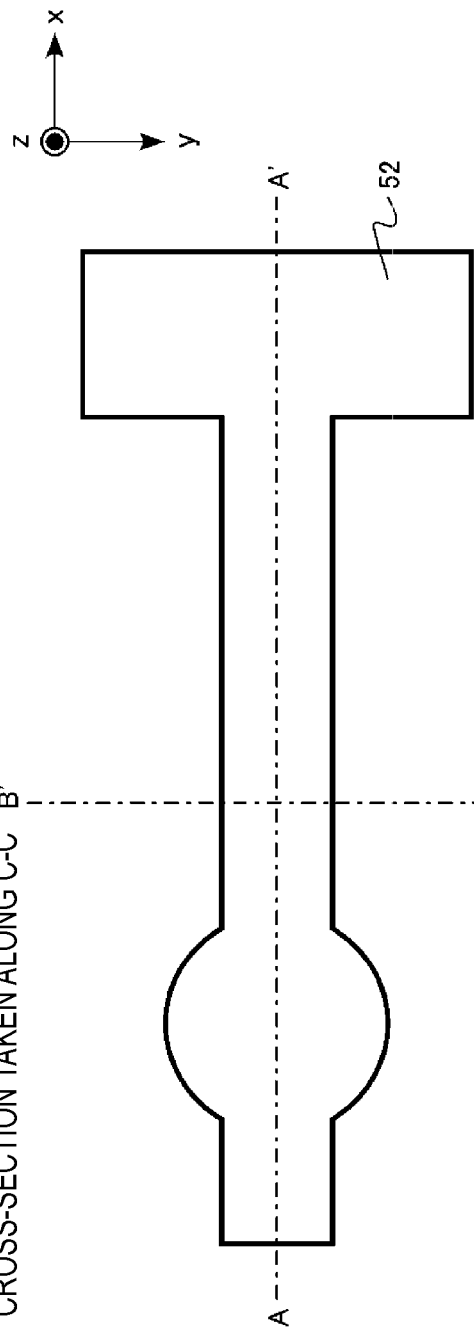
FIG. 6A CROSS-SECTION TAKEN ALONG C-C'
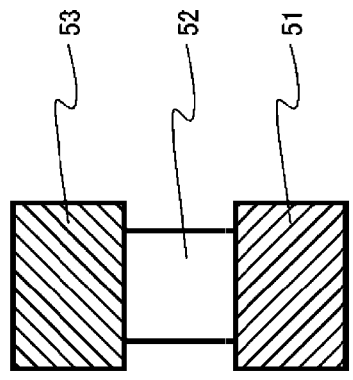
FIG. 6C CROSS-SECTION TAKEN ALONG B-B'
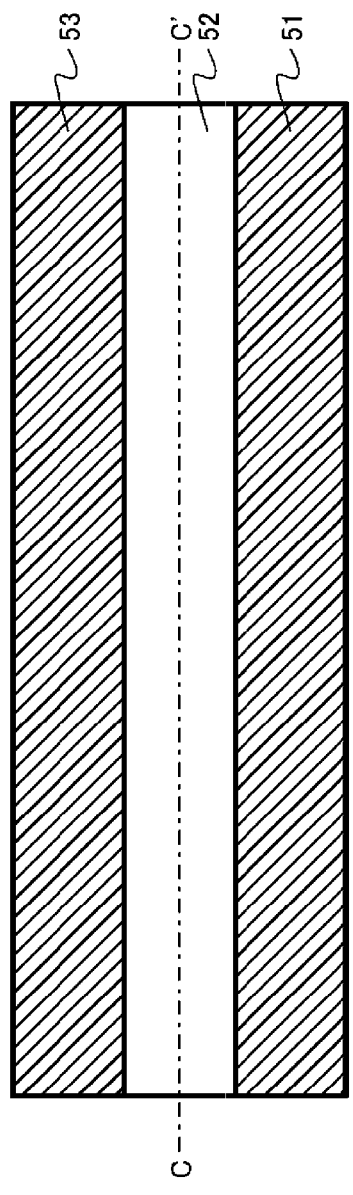
FIG. 6B CROSS-SECTION TAKEN ALONG A-A'

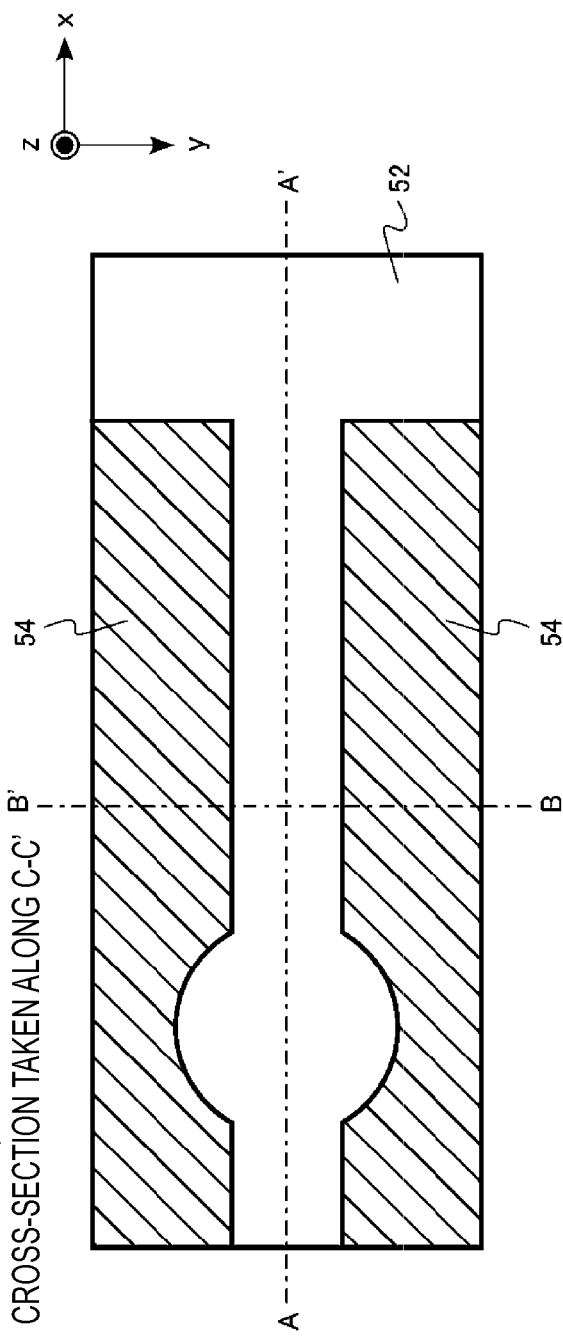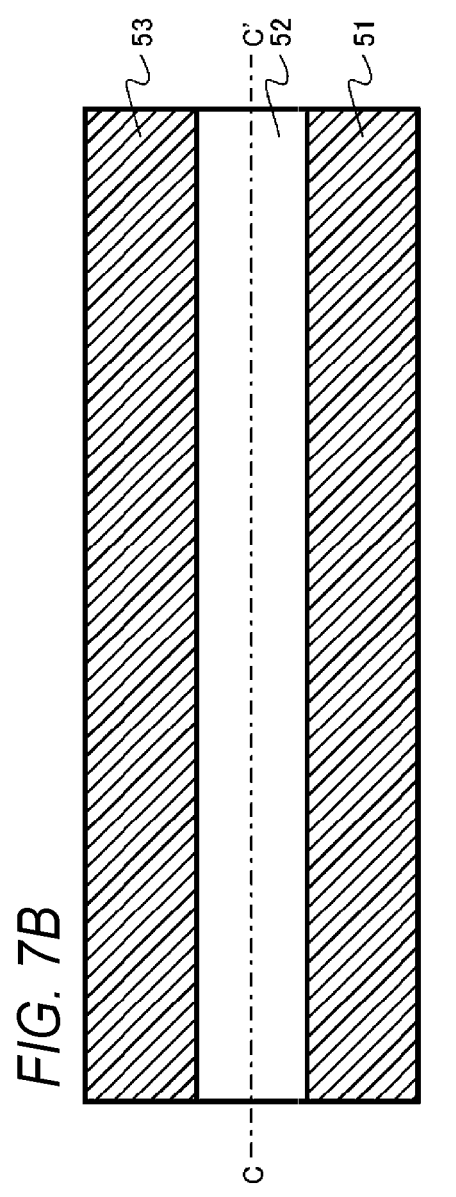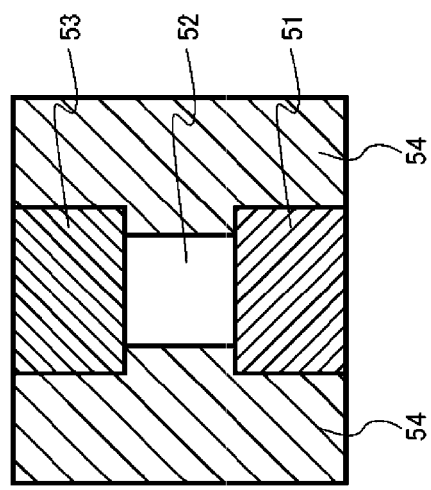

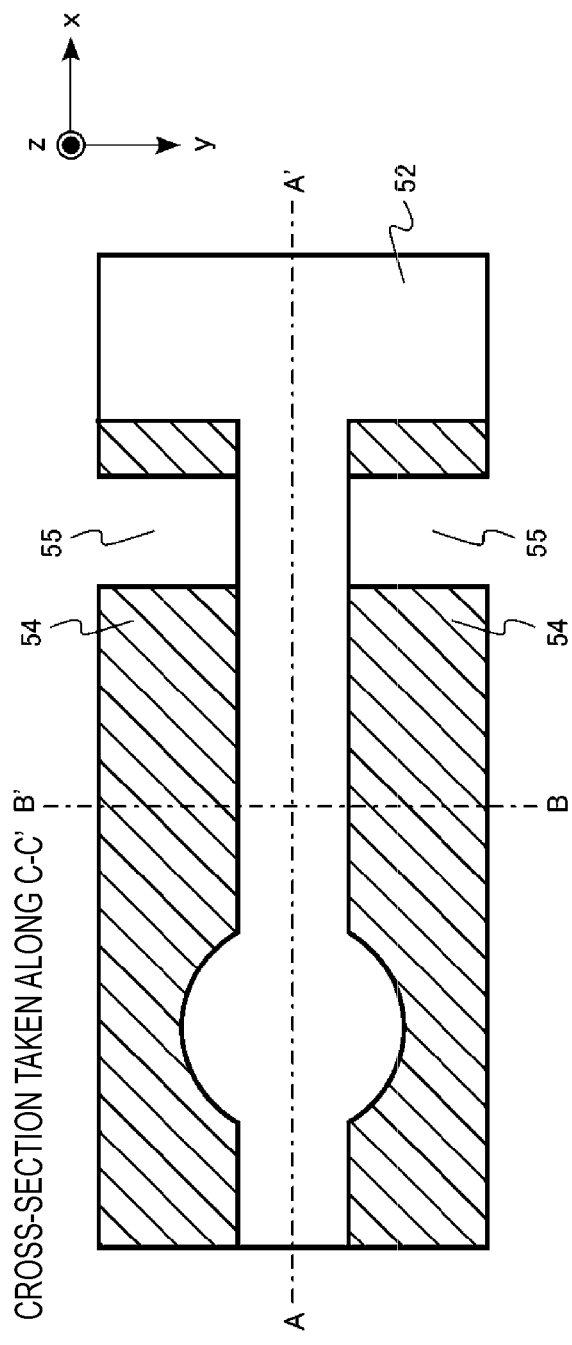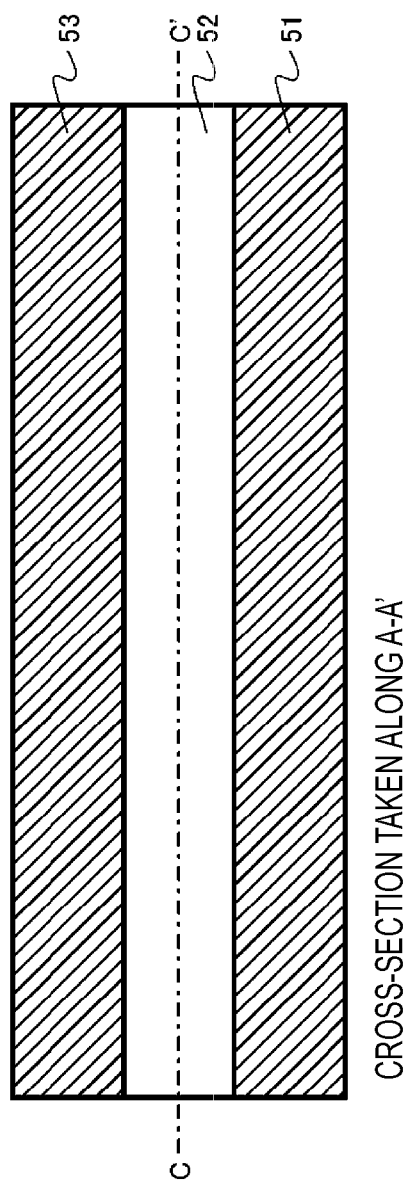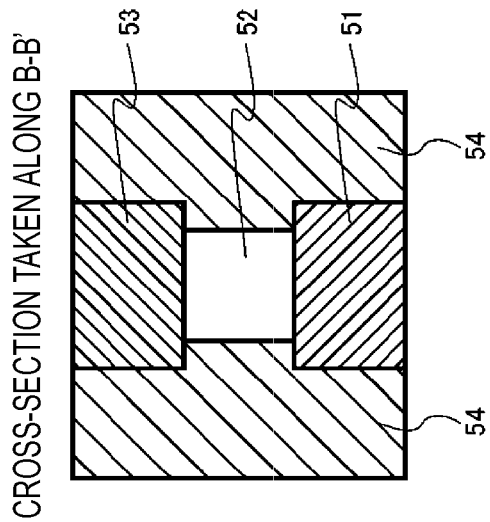

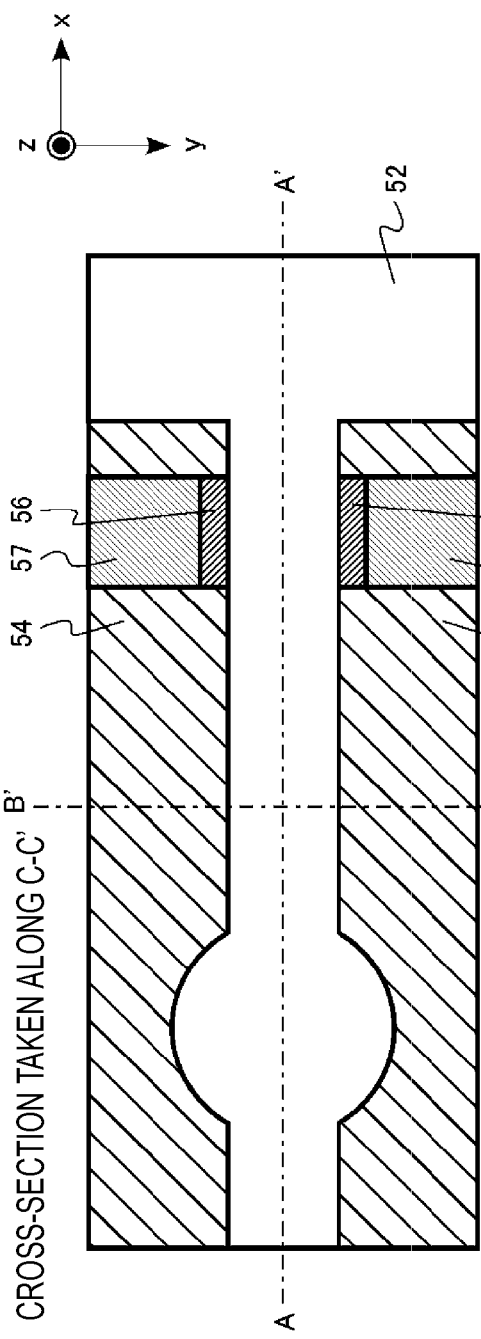
FIG. 9A  CROSS-SECTION TAKEN ALONG C-C'
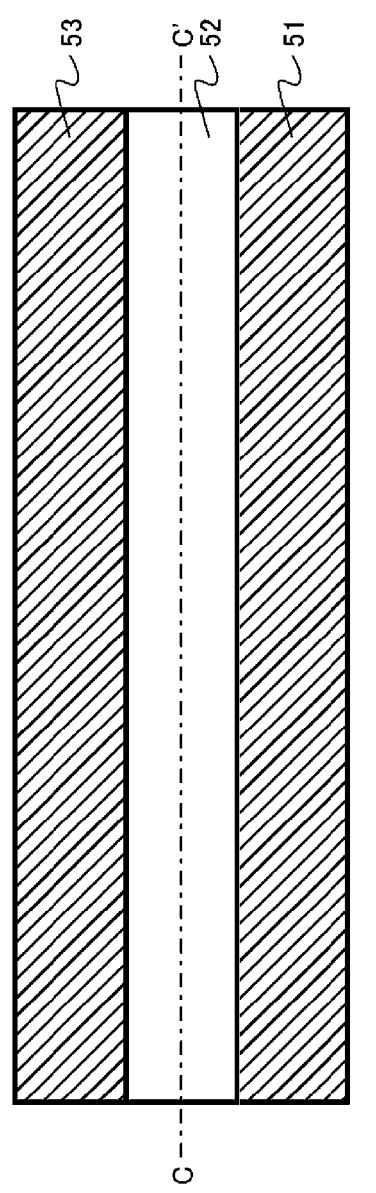
FIG. 9B  CROSS-SECTION TAKEN ALONG A-A'
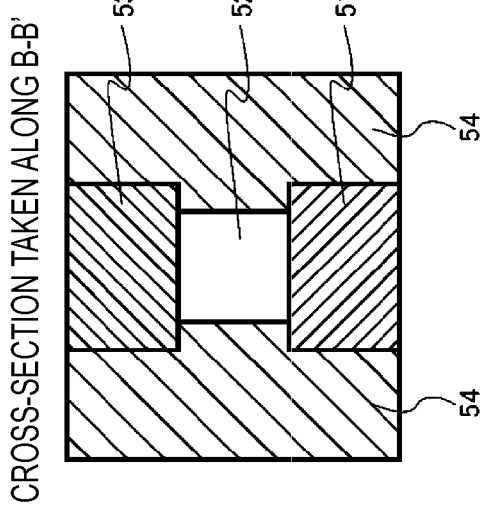
FIG. 9C  CROSS-SECTION TAKEN ALONG B-B'

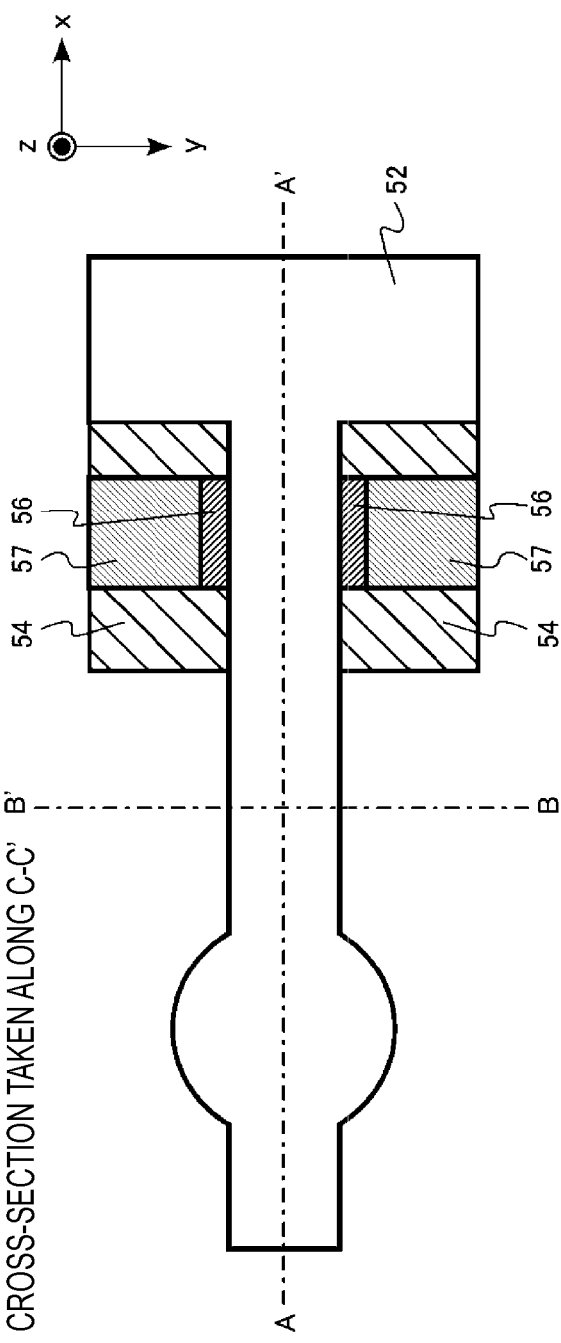
FIG. 10A CROSS-SECTION TAKEN ALONG C-C'
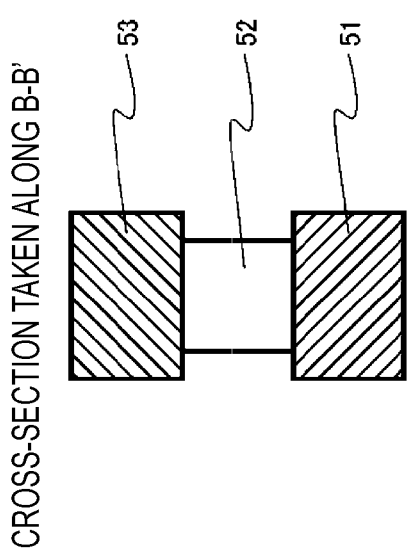
FIG. 10C CROSS-SECTION TAKEN ALONG B-B'
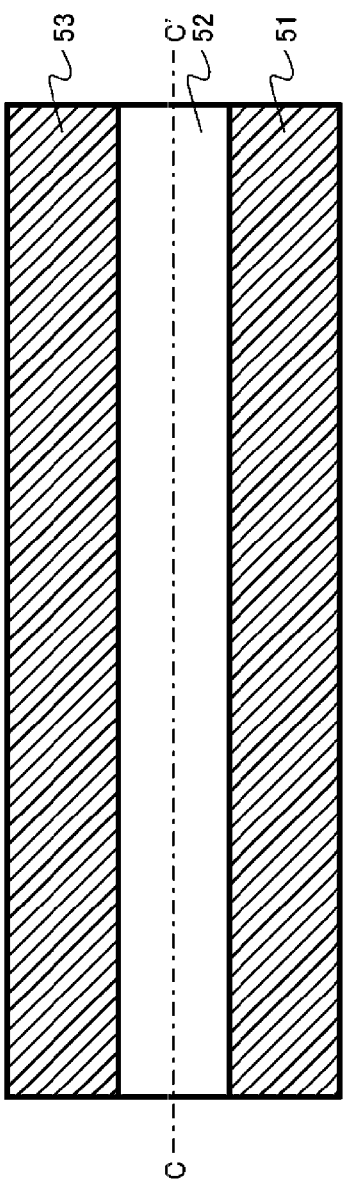
FIG. 10B CROSS-SECTION TAKEN ALONG A-A'

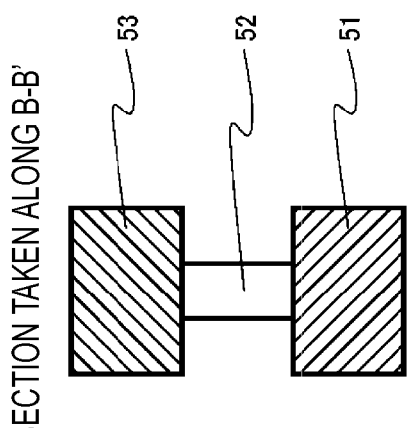
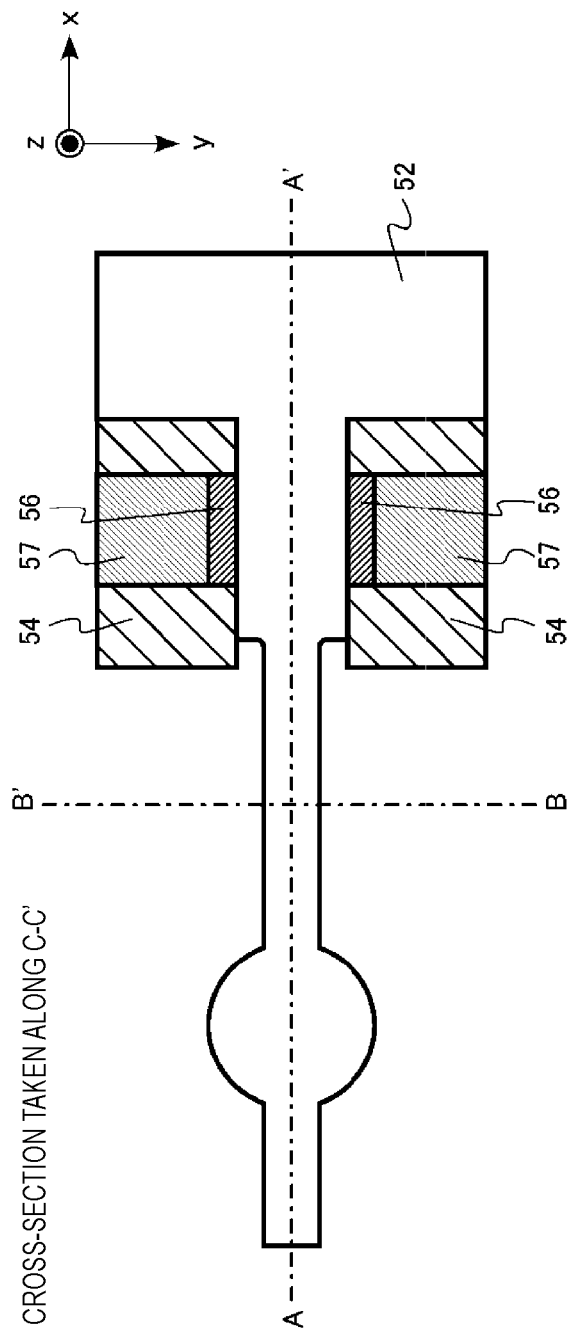
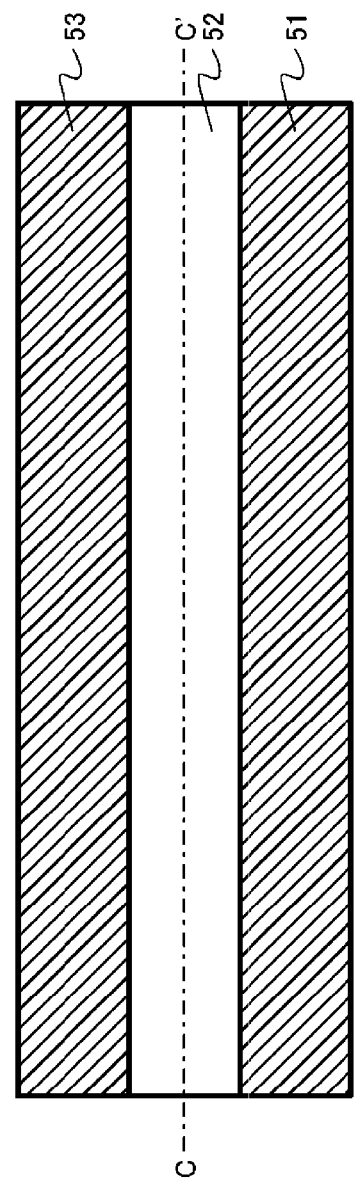
FIG. 11A CROSS-SECTION TAKEN ALONG C-C'
FIG. 11B CROSS-SECTION TAKEN ALONG A-A'
FIG. 11C CROSS-SECTION TAKEN ALONG B-B'

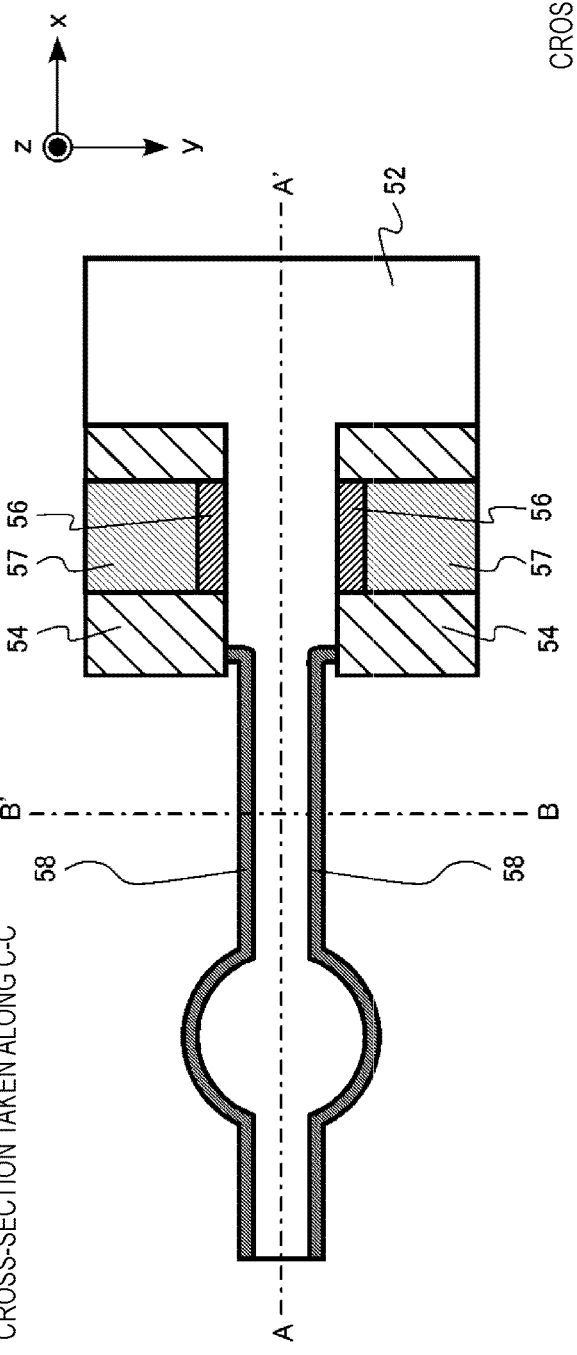
FIG. 12A
CROSS-SECTION TAKEN ALONG C-C'
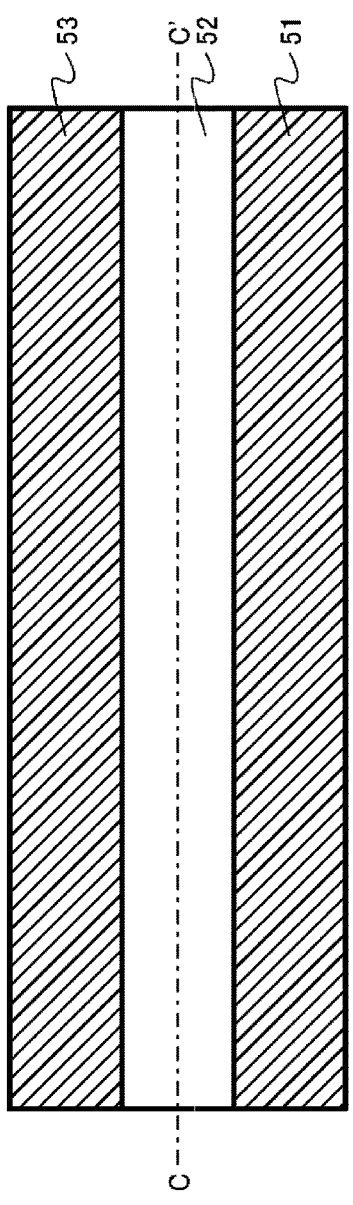
FIG. 12C
CROSS-SECTION TAKEN ALONG B-B'
FIG. 12B
CROSS-SECTION TAKEN ALONG A-A'

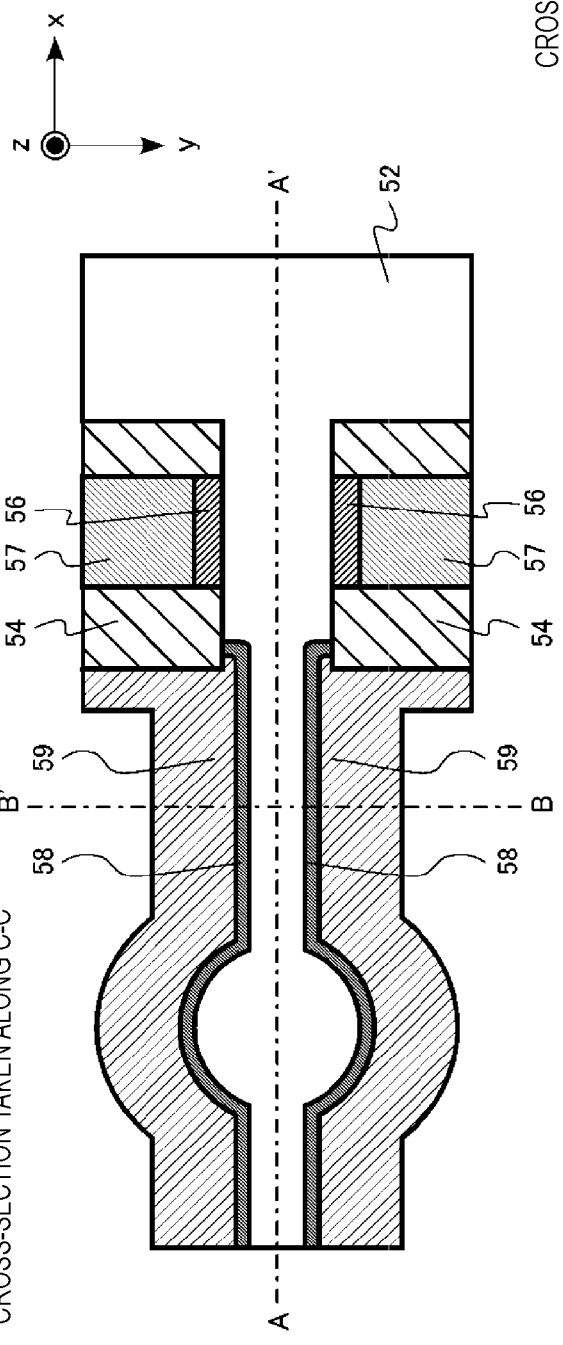
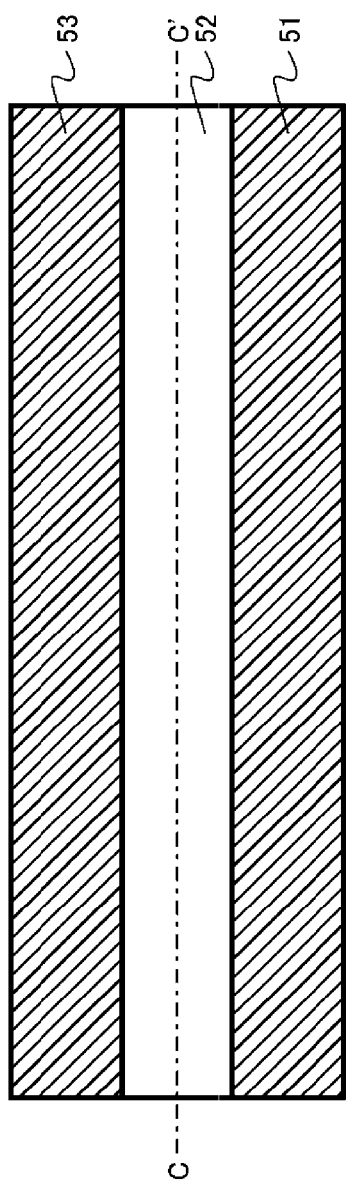
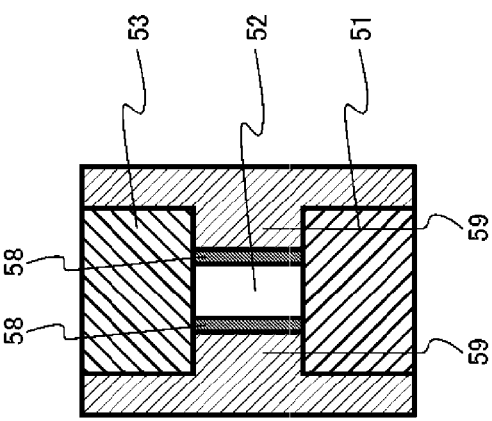
FIG. 13A CROSS-SECTION TAKEN ALONG C-C'
FIG. 13B CROSS-SECTION TAKEN ALONG A-A'
FIG. 13C CROSS-SECTION TAKEN ALONG B-B'

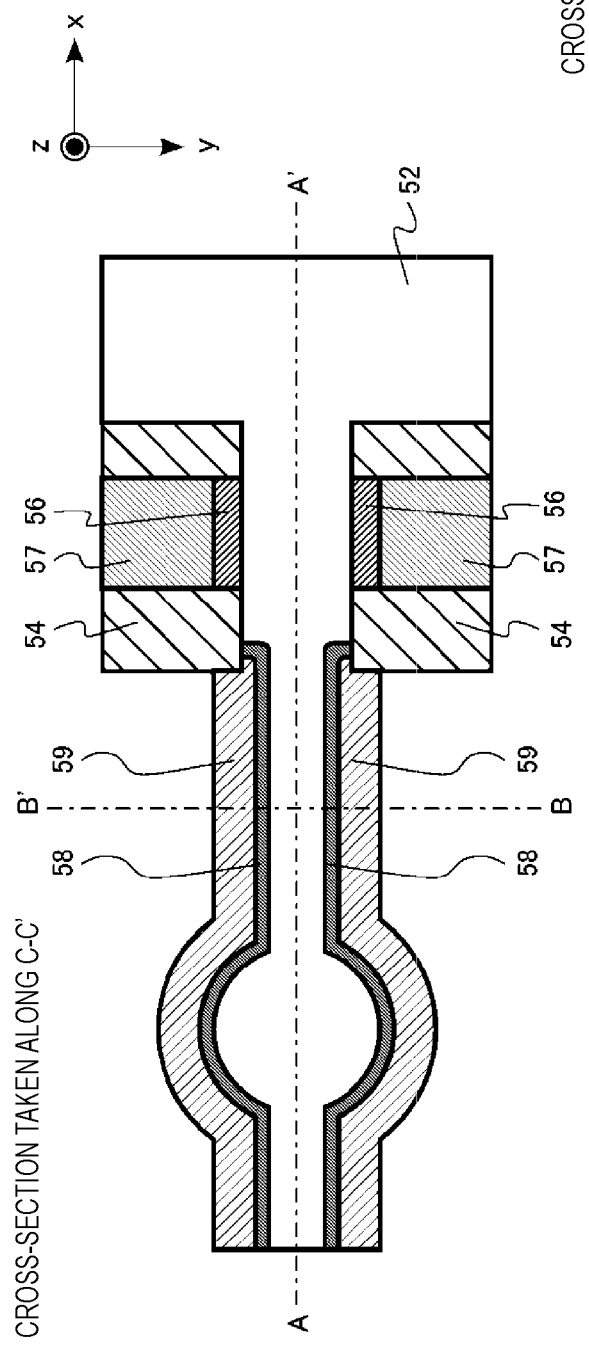
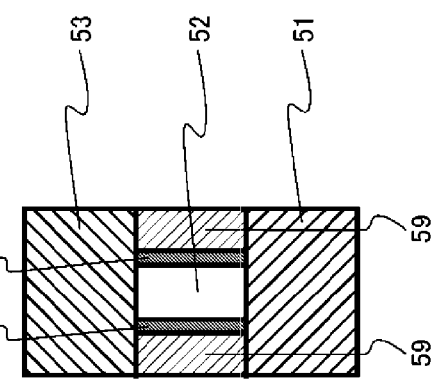
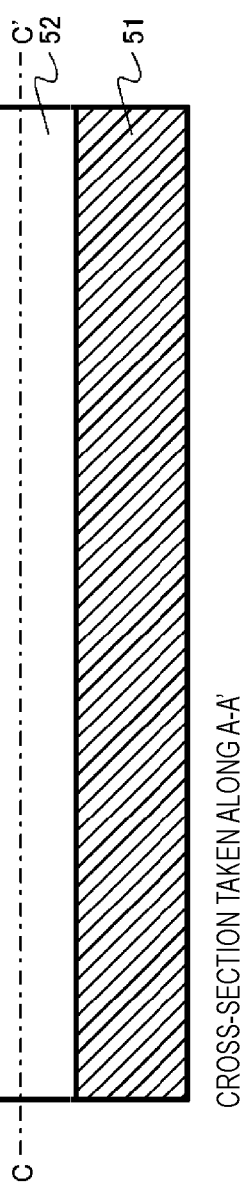
FIG. 14A CROSS-SECTION TAKEN ALONG C-C'
FIG. 14B CROSS-SECTION TAKEN ALONG A-A'
FIG. 14C CROSS-SECTION TAKEN ALONG B-B'

CROSS-SECTION TAKEN ALONG C-C'

CROSS-SECTION TAKEN ALONG B-B'

CROSS-SECTION TAKEN ALONG A-A'

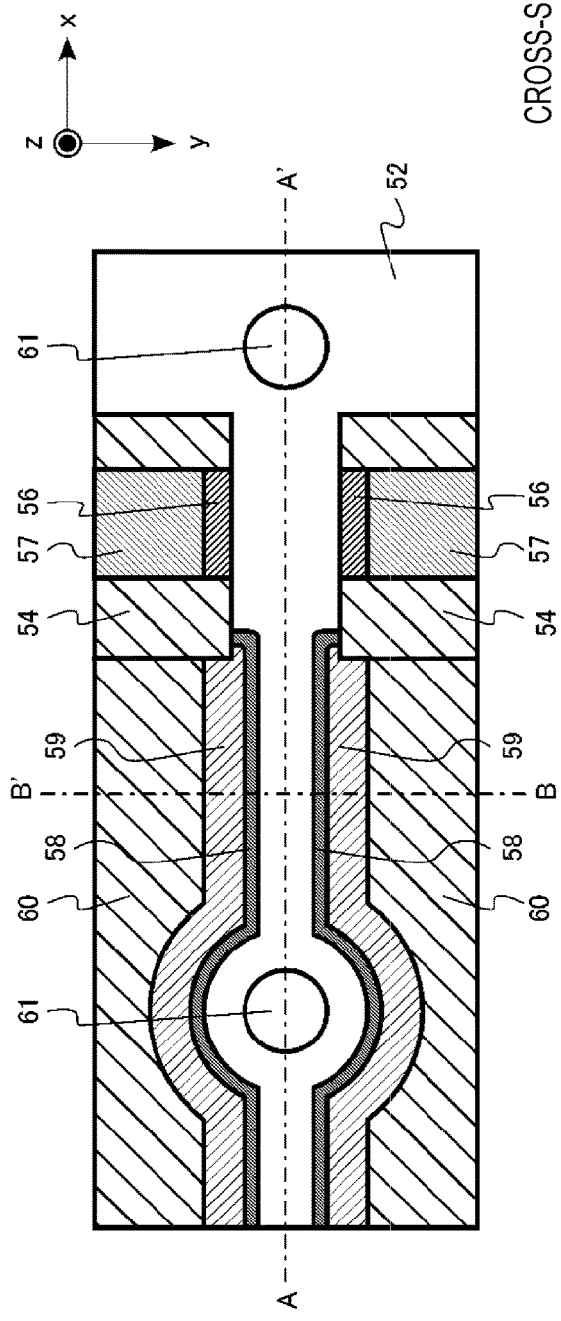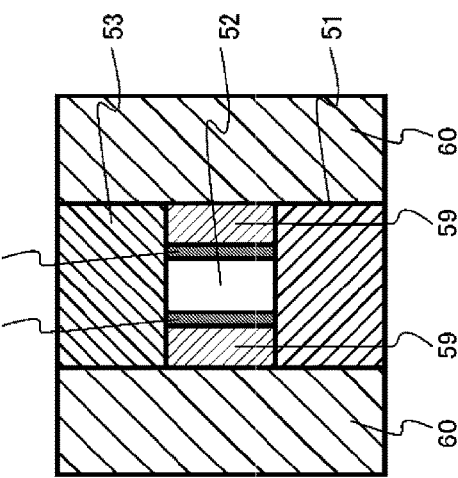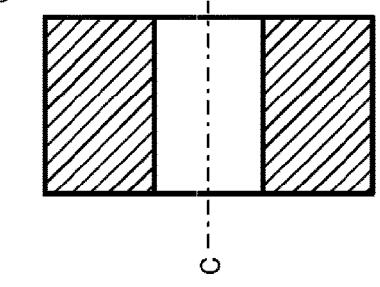

CROSS-SECTION TAKEN ALONG C-C'

CROSS-SECTION TAKEN ALONG B-B'

CROSS-SECTION TAKEN ALONG A-A'

SEMICONDUCTOR DEVICE AND SEMICONDUCTOR STORAGE DEVICE

CROSS-REFERENCE TO RELATED APPLICATION(S)

This application is based upon and claims the benefit of priority from Japanese Patent Application No. 2020-158213, filed on Sep. 23, 2020, the entire contents of which are incorporated herein by reference.

FIELD

Embodiments described herein relate generally to a semiconductor device and a semiconductor storage device.

BACKGROUND

A three-dimensional (3D) NAND flash memory in which memory cells are stacked three-dimensionally provides a high degree of integration and a low cost. By miniaturizing the memory cells of the three-dimensional NAND flash memory, it is possible to further increase the degree of integration.

In order to further increase the degree of integration of the three-dimensional NAND flash memory, miniaturization of a selection transistors used to select a memory cell during reading and writing of the memory cells is also required.

BRIEF DESCRIPTION OF THE DRAWINGS

FIG. 1A to FIG. 1C are schematic cross-sectional views of a semiconductor device of a first embodiment.

FIG. 2 is an enlarged schematic cross-sectional view of a semiconductor device of a first embodiment.

FIG. 3 is an enlarged schematic cross-sectional view of a semiconductor device of a first embodiment.

FIG. 4A to FIG. 4C are schematic cross-sectional views illustrating a method of manufacturing a semiconductor device of a first embodiment.

FIG. 6A to FIG. 6C are schematic cross-sectional views illustrating a method of manufacturing a semiconductor device of a first embodiment.

FIG. 7A to FIG. 7C are schematic cross-sectional views illustrating a method of manufacturing a semiconductor device of a first embodiment.

FIG. 8A to FIG. 8C are schematic cross-sectional views illustrating a method of manufacturing a semiconductor device of a first embodiment.

FIG. 9A to FIG. 9C are schematic cross-sectional views illustrating a method of manufacturing a semiconductor device of a first embodiment.

FIG. 10A to FIG. 10C are schematic cross-sectional views illustrating a method of manufacturing a semiconductor device of a first embodiment.

FIG. 11A to FIG. 11C are schematic cross-sectional views illustrating a method of manufacturing a semiconductor device of a first embodiment.

FIG. 12A to FIG. 12C are schematic cross-sectional views illustrating a method of manufacturing a semiconductor device of a first embodiment.

FIG. 13A to FIG. 13C are schematic cross-sectional views illustrating a method of manufacturing a semiconductor device of a first embodiment.

FIG. 14A to FIG. 14C are schematic cross-sectional views illustrating a method of manufacturing a semiconductor device of a first embodiment.

FIG. 16A to FIG. 16C are schematic cross-sectional views illustrating a method of manufacturing a semiconductor device of a first embodiment.

DETAILED DESCRIPTION

Figure 5A:
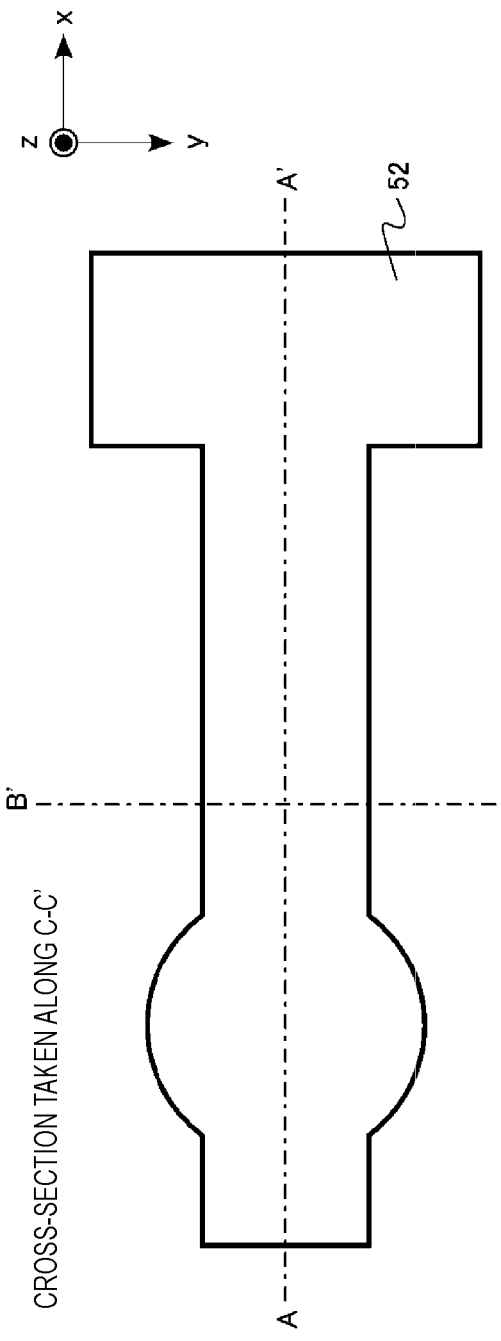
FIG. 5A to FIG. 5C are schematic cross-sectional views illustrating a method of manufacturing a semiconductor device of a first embodiment.

Embodiments provide a semiconductor device having a smaller overall size.

In general, according to one embodiment, a semiconductor device includes a first gate electrode, a second gate electrode, a semiconductor layer between the first and second gate electrodes and extending along a first direction, a first gate insulating layer between the first gate electrode and the semiconductor layer, a second gate insulating layer between the second gate electrode and the semiconductor layer, a first insulating layer including a first region that is adjacent to the first gate electrode in the first direction and contacts the semiconductor layer, and a second insulating layer including a second region that is adjacent to the second gate electrode in the first direction and contacts the semiconductor layer. A first interface between the first region and the semiconductor layer in a second direction crossing the first direction is located adjacent to the first gate electrode in the first direction.

Hereinafter, certain example embodiments will be described with reference to the drawings. In the following description, the same reference numerals will be given to the same or substantially similar members, and a description of such repeated members previously described once may be omitted as appropriate.

Further, in the present specification, the relative positional terms "upper" or "lower" may be used for convenience. However, these terms such as "upper" or "lower" are a terms indicating a relative positional relationship in the drawings. These terms do not necessarily define a positional relationship with respect to gravity.

The qualitative analysis and quantitative analysis of the chemical compositions of components, regions, or members constituting a semiconductor device or a semiconductor storage device in the present specification may be carried out by, for example, secondary ion mass spectrometry (SIMS) or energy dispersive X-ray spectroscopy (EDX). Further, for example, a transmission electron microscope (TEM) may be used for measuring the thicknesses o, distances, and the like.

In the present specification, when a component is described as "metal" this includes not only a simple substance of a metal but also a material containing a metal element and having metallic properties such as a metal compound. For example, a metal silicide and a metal nitride are also included in the definition of a "metal".

First Embodiment

A semiconductor device of a first embodiment is a metal oxide semiconductor field effect transistor (MOSFET) 100 having a double gate structure in which gate electrodes are provided on both sides of a channel layer sandwiched therebetween. The MOSFET 100 may be applied to, for example, a selection gate transistor ("select gate transistor" in a three-dimensional NAND flash memory.

FIGS. 1A, 1B and 1C are cross-sectional views of the MOSFET 100. Specifically, FIG. 1A is the cross-section taken along C-C' of FIG. 1B, FIG. 1B is the cross-section taken along A-A' of FIG. 1A, and FIG. 1C is the cross-section taken along B-B' of FIG. 1A.

FIG. 1A is the xy cross-section of the MOSFET 100. FIG. 1B is the xz cross-section of the MOSFET 100. FIG. 1C is an yz cross-section of the MOSFET 100.

Hereinafter, the x direction may be referred to as a first direction. The y direction may be referred to as a second direction. The z direction may be referred to as a third direction. In the present specification, the simplified term "the x direction" includes both the positive x direction (+x) and the negative x direction (−x). The y direction and the z direction are also the same as the case of the x direction.

The MOSFET 100 includes a semiconductor layer 10, a first gate electrode 11, a second gate electrode 12, a third gate electrode 13, a fourth gate electrode 14, a first gate insulating layer 21, a second gate insulating layer 22, a third gate insulating layer 23, a fourth gate insulating layer 24, a source electrode 26, a drain electrode 28, a first interlayer insulating layer 31, a second interlayer insulating layer 32, a third interlayer insulating layer 33, and a fourth interlayer insulating layer 34. The first interlayer insulating layer 31 has a first region 31a. The second interlayer insulating layer 32 has a second region 32a.

The semiconductor layer 10 is provided between the first gate electrode 11 and the second gate electrode 12. The semiconductor layer 10 extends along the x direction. The semiconductor layer 10 functions as a channel layer of the MOSFET 100.

The semiconductor layer 10 is, for example, a polycrystalline semiconductor. The semiconductor layer 10 comprises, for example, polycrystalline silicon. The semiconductor layer 10 is, for example, a polycrystalline silicon layer.

The semiconductor layer 10 is, for example, p-type polycrystalline silicon containing a p-type impurity. The p-type impurity is, for example, boron (B). The concentration of the p-type impurity of the semiconductor layer 10 is, for example, $1 \times 10^{17}$ cm$^3$ or more and $5 \times 10^{18}$ cm$^3$ or less.

The width in the y direction (W1 in FIG. 1A) of a region of the semiconductor layer 10 sandwiched between the first gate electrode 11 and the second gate electrode 12 is smaller than the width in the y direction (W2 in FIG. 1A) of a region sandwiched between a portion where the semiconductor layer 10 is in contact with the first interlayer insulating layer 31 and a portion where the semiconductor layer 10 is in contact with the second interlayer insulating layer 32.

The width W1 is, for example, three quarters or less of the width W2. The width W1 is, for example, 10 nm or more and 50 nm or less. The width W2 is, for example, 20 nm or more and 100 nm or less.

The thickness of the semiconductor layer 10 in the z direction is, for example, 5 nm or more and 30 nm or less.

The first gate electrode 11 is a conductor. The first gate electrode 11 comprises, for example, polycrystalline silicon. The first gate electrode 11 is, for example, p-type polycrystalline silicon containing a p-type impurity. The p-type impurity is, for example, boron (B). The first gate electrode 11 is, for example, n-type polycrystalline silicon containing an n-type impurity. The n-type impurity is, for example, arsenic (As) or phosphorus (P).

The second gate electrode 12 is a conductor. The second gate electrode 12 comprises, for example, polycrystalline silicon. The second gate electrode 12 is, for example, p-type polycrystalline silicon containing a p-type impurity. The p-type impurity is, for example, boron (B). The second gate electrode 12 is, for example, n-type polycrystalline silicon containing an n-type impurity. The n-type impurity is, for example, arsenic (As) or phosphorus (P).

The first gate electrode 11 and the second gate electrode 12 are electrically connected to each other.

The third gate electrode 13 is provided on the +x side of the first gate electrode 11. The first region 31a of the first interlayer insulating layer 31 is provided between the third gate electrode 13 and the first gate electrode 11.

The third gate electrode 13 has a function of forming an n-type inversion layer on the opposite semiconductor layer 10. The n-type inversion layer formed on the semiconductor layer 10 functions as a source region of the MOSFET 100.

A structure in which an n-type impurity is introduced into the semiconductor layer 10 to provide an n-type source region without providing the third gate electrode 13 is also possible.

The third gate electrode 13 is a conductor. The third gate electrode 13 is, for example, a metal or a semiconductor. The third gate electrode 13 comprises, for example, tungsten (W).

The fourth gate electrode 14 is provided on the +x side of the second gate electrode 12. The second region 32a of the second interlayer insulating layer 32 is provided between the fourth gate electrode 14 and the second gate electrode 12. The semiconductor layer 10 is provided between the third gate electrode 13 and the fourth gate electrode 14.

The fourth gate electrode 14 has a function of forming an n-type inversion layer on the opposite semiconductor layer 10. The n-type inversion layer formed on the semiconductor layer 10 functions as a source region of the MOSFET 100.

A structure in which an n-type impurity is introduced into the semiconductor layer 10 to provide an n-type source region without providing the fourth gate electrode 14 is also possible.

The fourth gate electrode 14 is a conductor. The fourth gate electrode 14 is, for example, a metal or a semiconductor. The fourth gate electrode 14 comprises, for example, tungsten (W).

The first gate insulating layer 21 is provided between the first gate electrode 11 and the semiconductor layer 10. The first gate insulating layer 21 is in contact with the semiconductor layer 10.

The first gate insulating layer 21 is, for example, an oxide, a nitride, or an oxynitride. The first gate insulating layer 21 comprises, for example, silicon oxide. The first gate insulating layer 21 is, for example, a silicon oxide layer. The thickness of the first gate insulating layer 21 in the y direction is, for example, 3 nm or more and 10 nm or less.

The second gate insulating layer 22 is provided between the second gate electrode 12 and the semiconductor layer 10. The second gate insulating layer 22 is in contact with the semiconductor layer 10.

The second gate insulating layer 22 is, for example, an oxide, a nitride, or an oxynitride. The second gate insulating layer 22 comprises, for example, silicon oxide. The second gate insulating layer 22 is, for example, a silicon oxide layer. The thickness of the second gate insulating layer 22 in the y direction is, for example, 3 nm or more and 10 nm or less.

The third gate insulating layer 23 is provided between the third gate electrode 13 and the semiconductor layer 10. The third gate insulating layer 23 is in contact with the semiconductor layer 10.

The third gate insulating layer 23 is, for example, an oxide, a nitride, or an oxynitride. The third gate insulating layer 23 comprises silicon oxide. The third gate insulating layer 23 is a silicon oxide layer. The thickness of the third gate insulating layer 23 in the y direction is, for example, 3 nm or more and 10 nm or less.

The fourth gate insulating layer 24 is provided between the fourth gate electrode 14 and the semiconductor layer 10. The fourth gate insulating layer 24 is in contact with the semiconductor layer 10.

The fourth gate insulating layer 24 is, for example, an oxide, a nitride, or an oxynitride. The fourth gate insulating layer 24 comprises, for example, silicon oxide. The fourth gate insulating layer 24 is, for example, a silicon oxide layer. The thickness of the fourth gate insulating layer 24 in the y direction is, for example, 3 nm or more and 10 nm or less.

The source electrode 26 is provided on the +x side of the drain electrode 28. The source electrode 26 is farther from the drain electrode 28 than the end of the first gate electrode 11 in the x direction.

The source electrode 26 extends along the z direction. The source electrode 26 is surrounded by the semiconductor layer 10. The source electrode 26 is electrically connected to the semiconductor layer 10. The source electrode 26 is in contact with the semiconductor layer 10.

The source electrode 26 is a conductor. The source electrode 26 is, for example, a metal. The source electrode 26 comprises, for example, tungsten (W).

The drain electrode 28 is provided between the first gate insulating layer 21 and the second gate insulating layer 22. The drain electrode 28 extends along the z direction. The drain electrode 28 is surrounded by the semiconductor layer 10. The drain electrode 28 is electrically connected to the semiconductor layer 10. The drain electrode 28 is in contact with the semiconductor layer 10.

The drain electrode 28 is a conductor. The drain electrode 28 is, for example, a metal. The drain electrode 28 comprises, for example, tungsten (W).

The first interlayer insulating layer 31 has the first region 31a. The first region 31a and the first gate electrode 11 are provided along the x direction. The first region 31a is provided on the +x side of the first gate electrode 11. The first region 31a is in contact with the semiconductor layer 10.

The first interlayer insulating layer 31 is, for example, an oxide, a nitride, or an oxynitride. The first interlayer insulating layer 31 comprises, for example, silicon oxide. The first interlayer insulating layer 31 is, for example, a silicon oxide layer.

The second interlayer insulating layer 32 has the second region 32a. The second region 32a and the second gate electrode 12 are provided along the x direction. The second region 32a is provided on the +x side of the second gate electrode 12. The second region 32a is in contact with the semiconductor layer 10. The semiconductor layer 10 is provided between the first interlayer insulating layer 31 and the second interlayer insulating layer 32.

The second interlayer insulating layer 32 is, for example, an oxide, a nitride, or an oxynitride. The second interlayer insulating layer 32 comprises, for example, silicon oxide. The second interlayer insulating layer 32 is, for example, a silicon oxide layer.

The third interlayer insulating layer 33 is provided on the semiconductor layer 10. The third interlayer insulating layer 33 is provided on the +z side of the semiconductor layer 10. The third interlayer insulating layer 33 is in contact with the semiconductor layer 10.

The third interlayer insulating layer 33 is, for example, an oxide, a nitride, or an oxynitride. The third interlayer insulating layer 33 comprises, for example, silicon oxide. The third interlayer insulating layer 33 is, for example, a silicon oxide layer.

The fourth interlayer insulating layer 34 is provided below the semiconductor layer 10. The semiconductor layer is provided on the +z side of the fourth interlayer insulating layer 34. The semiconductor layer 10 is provided between the third interlayer insulating layer 33 and the fourth interlayer insulating layer 34. The fourth interlayer insulating layer 34 is in contact with the semiconductor layer 10.

The fourth interlayer insulating layer 34 is, for example, an oxide, a nitride, or an oxynitride. The fourth interlayer insulating layer 34 comprises, for example, silicon oxide. The fourth interlayer insulating layer 34 is, for example, a silicon oxide layer.

FIG. 2 illustrates a region R1 surrounded by a broken line in FIG. 1A. FIG. 2 is an enlarged view of the vicinity of the end of the first gate electrode 11 in the x direction.

As illustrated in FIG. 2, an extension L1 of an interface X1 between the first region 31a and the semiconductor layer 10 intersects with the first gate electrode 11. In other words, an interface X2 between the first gate electrode 11 and the first gate insulating layer 21 is on the side of the second gate electrode 12 in the y direction with respect to the interface X1.

The distance d shown in FIG. 2 between the extension L1 of the interface X1 and an interface X3 between the semiconductor layer 10 and the first gate insulating layer 21 is, for example, 5 nm or more and 20 nm or less.

The first gate electrode 11 has a protrusion 11a extending along the x direction on the side of the semiconductor layer 10 at the end thereof on the side of the first region 31a. The protrusion 11a is on the side of the second gate electrode 12 in the y direction with respect to the extension L1 of the interface X1.

FIG. 3 illustrates a region R2 surrounded by a broken line in FIG. 1A. FIG. 3 is an enlarged view of the vicinity of the end of the second gate electrode 12 in the x direction.

As illustrated in FIG. 3, an extension L2 of an interface Y1 between the second region 32a and the semiconductor layer 10 intersects with the second gate electrode 12. In other words, an interface Y2 between the second gate electrode 12 and the second gate insulating layer 22 is on the side of the first gate electrode 11 in the y direction with respect to the interface Y1.

The distance d shown in FIG. 3 between the extension L2 of the interface Y1 and an interface Y3 between the semiconductor layer 10 and the second gate insulating layer 22 is, for example, 5 nm or more and 20 nm or less.

The second gate electrode 12 has a protrusion 12a extending along the x direction on the side of the semiconductor layer 10 at the end thereof on the side of the second region 32a. The protrusion 12a is on the side of the first gate electrode 11 in the y direction with respect to the extension L2 of the interface Y1.

Next, an example of a method of manufacturing the MOSFET 100 will be described.

FIG. 4A through FIG. 17C are schematic cross-sectional views illustrating a method of manufacturing the MOSFET 100. FIGS. 4A, 4B and 4C to FIGS. 17A, 17B and 17C are views illustrating the cross-sections corresponding to FIGS. 1A, 1B and 1C.

First, as shown in FIG. 4A through FIG. 4C, a silicon oxide layer 51, a polycrystalline silicon layer 52, and a silicon oxide layer 53 are formed on a silicon substrate. The silicon oxide layer 51, the polycrystalline silicon layer 52, and the silicon oxide layer 53 are formed by, for example, a chemical vapor deposition method (CVD method).

A part of the silicon oxide layer 51 finally becomes the fourth interlayer insulating layer 34. A part of the polycrystalline silicon layer 52 becomes the semiconductor layer 10. A part of the silicon oxide layer 53 finally becomes the third interlayer insulating layer 33.

Figure 5B:
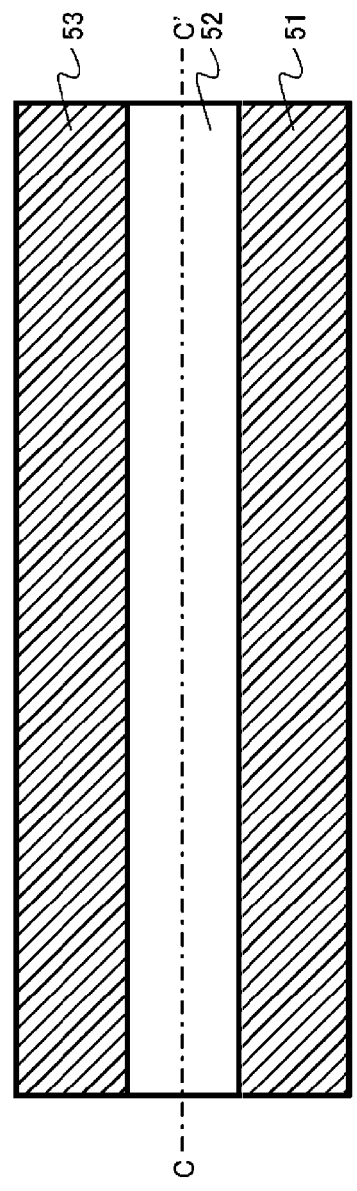
Figure 5C:
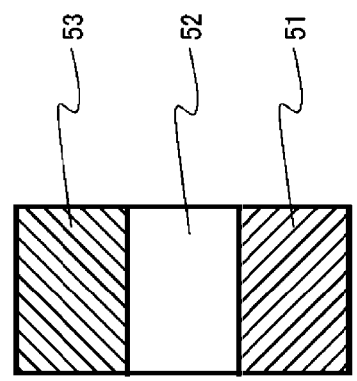

Next, as shown FIG. 5A through FIG. 5C, the silicon oxide layer 51, the polycrystalline silicon layer 52, and the silicon oxide layer 53 are patterned. The patterning of the silicon oxide layer 51, the polycrystalline silicon layer 52, and the silicon oxide layer 53 is performed by, for example, a lithography method and a reactive ion etching method (RIE method).

Next, as shown in FIG. 6A through FIG. 6C, the polycrystalline silicon layer 52 is selectively etched to retract in the y direction with respect to the silicon oxide layer 51 and the silicon oxide layer 53. The etching of the polycrystalline silicon layer 52 is performed by, for example, a wet etching method.

Next, as shown in FIG. 7A through FIG. 7C, a silicon oxide layer 54 is formed. The silicon oxide layer 54 is formed by, for example, a CVD method. A part of the silicon oxide layer 54 finally becomes the first interlayer insulating layer 31 and the second interlayer insulating layer 32.

Next, as shown in FIG. 8A through FIG. 8C, a hole 55 is perforated in the silicon oxide layer 54. The hole 55 is formed by, for example, a lithography method and an RIE method.

Next, as shown in FIG. 9A through FIG. 9C, a silicon oxide layer 56 and a tungsten layer 57 are formed in the hole 55. The silicon oxide layer 56 and the tungsten layer 57 are formed by, for example, a CVD method. The silicon oxide layer 56 finally becomes the third gate insulating layer 23 and the fourth gate insulating layer 24. Further, the tungsten layer 57 finally becomes the third gate electrode 13 and the fourth gate electrode 14.

Next, as shown in FIG. 10A through FIG. 10C, a part of the silicon oxide layer 54 is removed. For example, a lithography method and an RIE method are used to remove a part of the silicon oxide layer 54.

Next, as shown in FIG. 11A through FIG. 11C, the polycrystalline silicon layer 52 is selectively etched to retract in the y direction with respect to the silicon oxide layer 51 and the silicon oxide layer 53. The etching of the polycrystalline silicon layer 52 is performed by, for example, a wet etching method.

Next, as shown in FIG. 12A through FIG. 12C, a silicon oxide layer 58 is formed on the polycrystalline silicon layer 52. The silicon oxide layer 58 is formed, for example, by thermally oxidizing the polycrystalline silicon layer 52. The silicon oxide layer 58 finally becomes the first gate insulating layer 21 and the second gate insulating layer 22.

Next, as shown in FIG. 13A through FIG. 13C, a polycrystalline silicon layer 59 is formed. The polycrystalline silicon layer 59 is formed by, for example, a CVD method. A part of the polycrystalline silicon layer finally becomes the first gate electrode 11 and the second gate electrode 12.

Next, as shown in FIG. 14A through FIG. 14C, the polycrystalline silicon layer 59 is scraped off by etching, so that a part of the polycrystalline silicon layer 59 remains in a region sandwiched between the silicon oxide layer 51 and the silicon oxide layer 53.

Figure 15A:
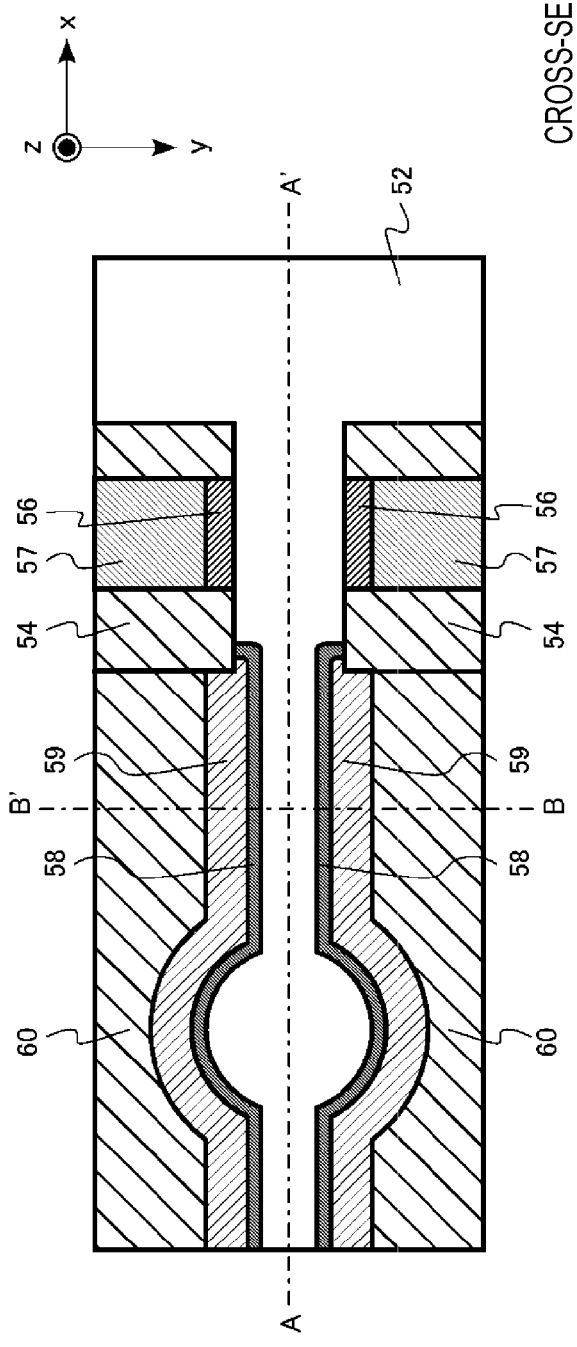
FIG. 15A to FIG. 15C are schematic cross-sectional views illustrating a method of manufacturing a semiconductor device of a first embodiment.
Figure 15C:
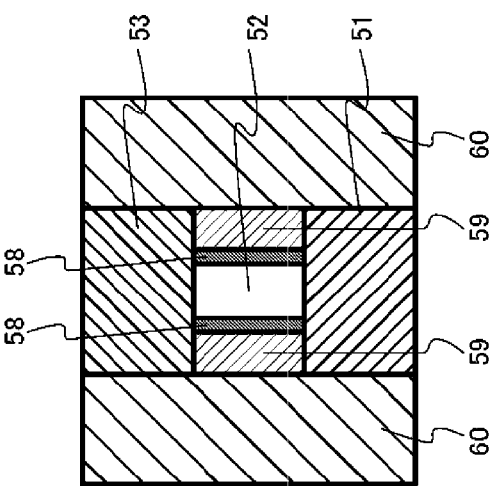
Figure 15B:
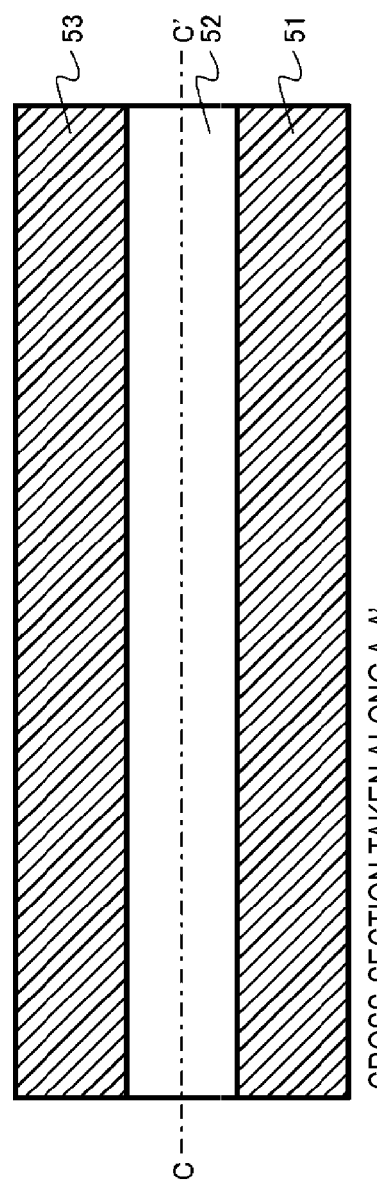

Next, as shown in FIG. 15A through FIG. 15C, a silicon oxide layer 60 is formed. The silicon oxide layer 60 is formed by, for example, a CVD method. The silicon oxide layer 60 finally becomes a part of the first interlayer insulating layer 31 and the second interlayer insulating layer 32.

Next, as shown in FIG. 16A through FIG. 16C, a hole 61 is formed in the polycrystalline silicon layer 52. The hole 61 penetrates the silicon oxide layer 51, the polycrystalline silicon layer 52, and the silicon oxide layer 53. The hole 61 is formed using, for example, a lithography method and an RIE method.

Figure 17A:
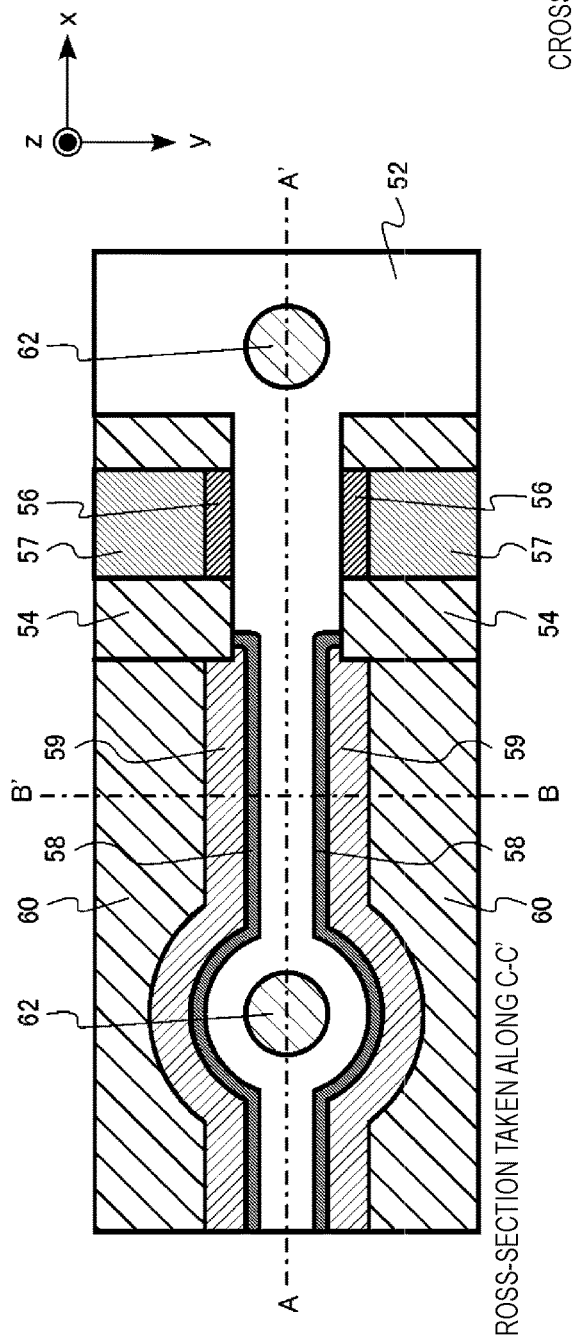
FIG. 17A to FIG. 17C are schematic cross-sectional views illustrating a method of manufacturing a semiconductor device of a first embodiment.
Figure 17C:
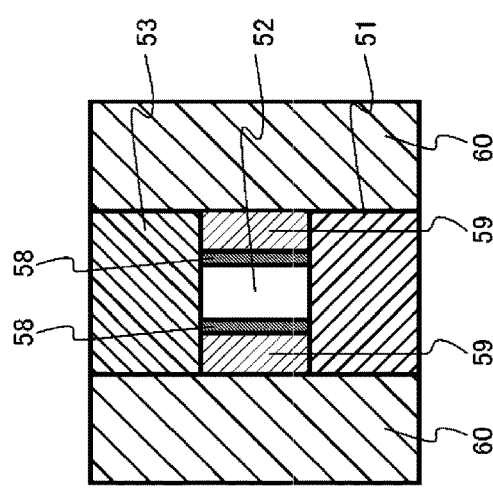
Figure 17B:
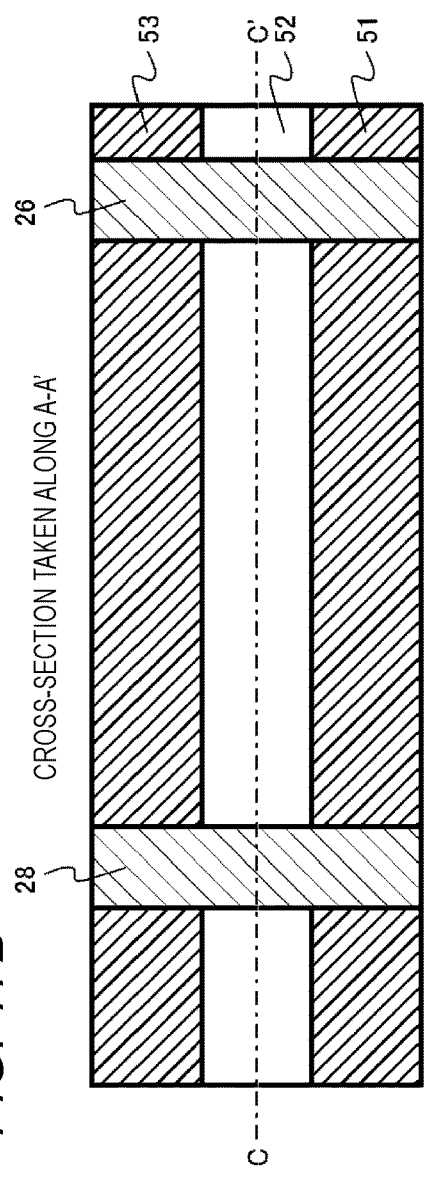

Next, as shown in FIG. 17A through FIG. 17C, a tungsten layer 62 is formed in the hole 61. The tungsten layer 62 is formed by, for example, a CVD method. The tungsten layer finally becomes the source electrode 26 and the drain electrode 28.

The MOSFET 100 is manufactured by the above manufacturing method.

Next, actions and effects of the MOSFET 100 will be described.

Figure 18:
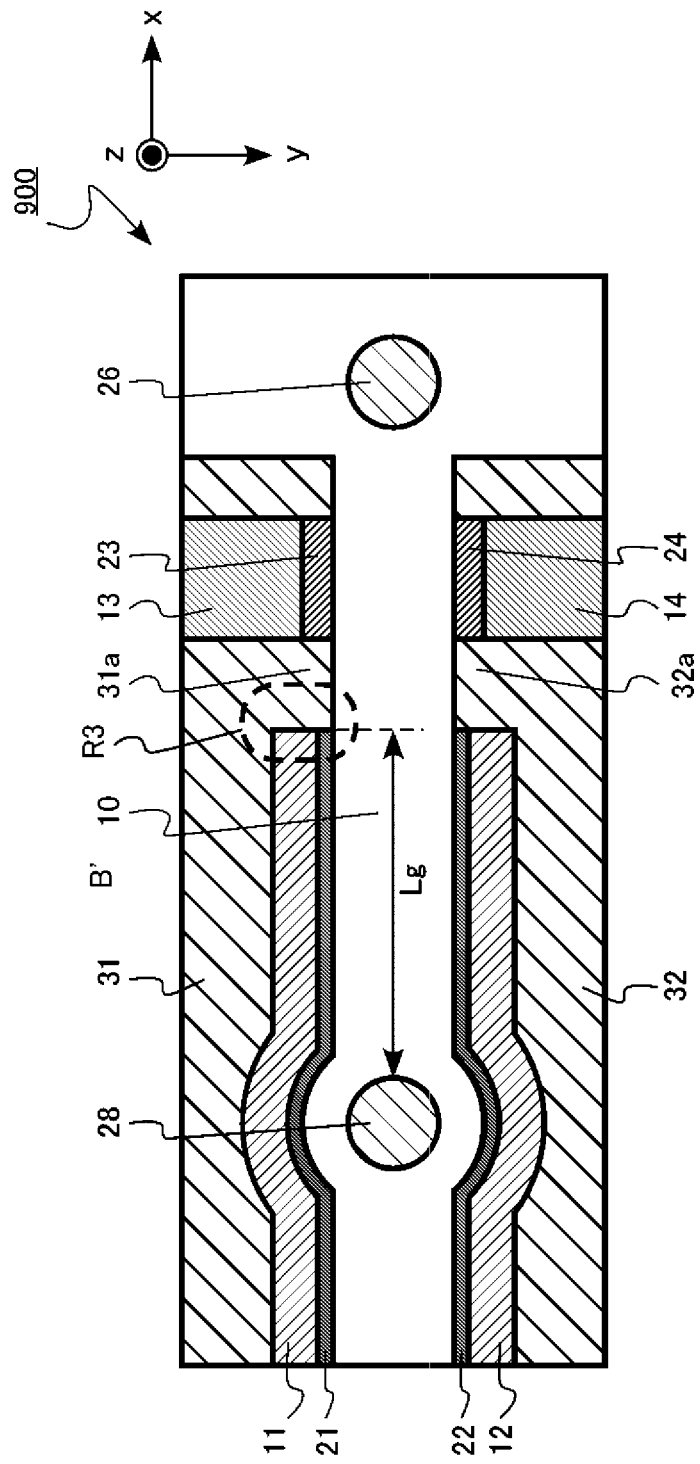
FIG. 18 is a schematic cross-sectional view of a semiconductor device of a comparative example.

FIG. 18 is a schematic cross-sectional view of a MOSFET 900 of a comparative example. The MOSFET 900 of the comparative example is different from the MOSFET 100 in that the extension of the interface between the first region 31a and the semiconductor layer 10 does not intersect with the first gate electrode 11.

FIG. 18 is the cross-section corresponding to FIG. 1A.

Figure 19:
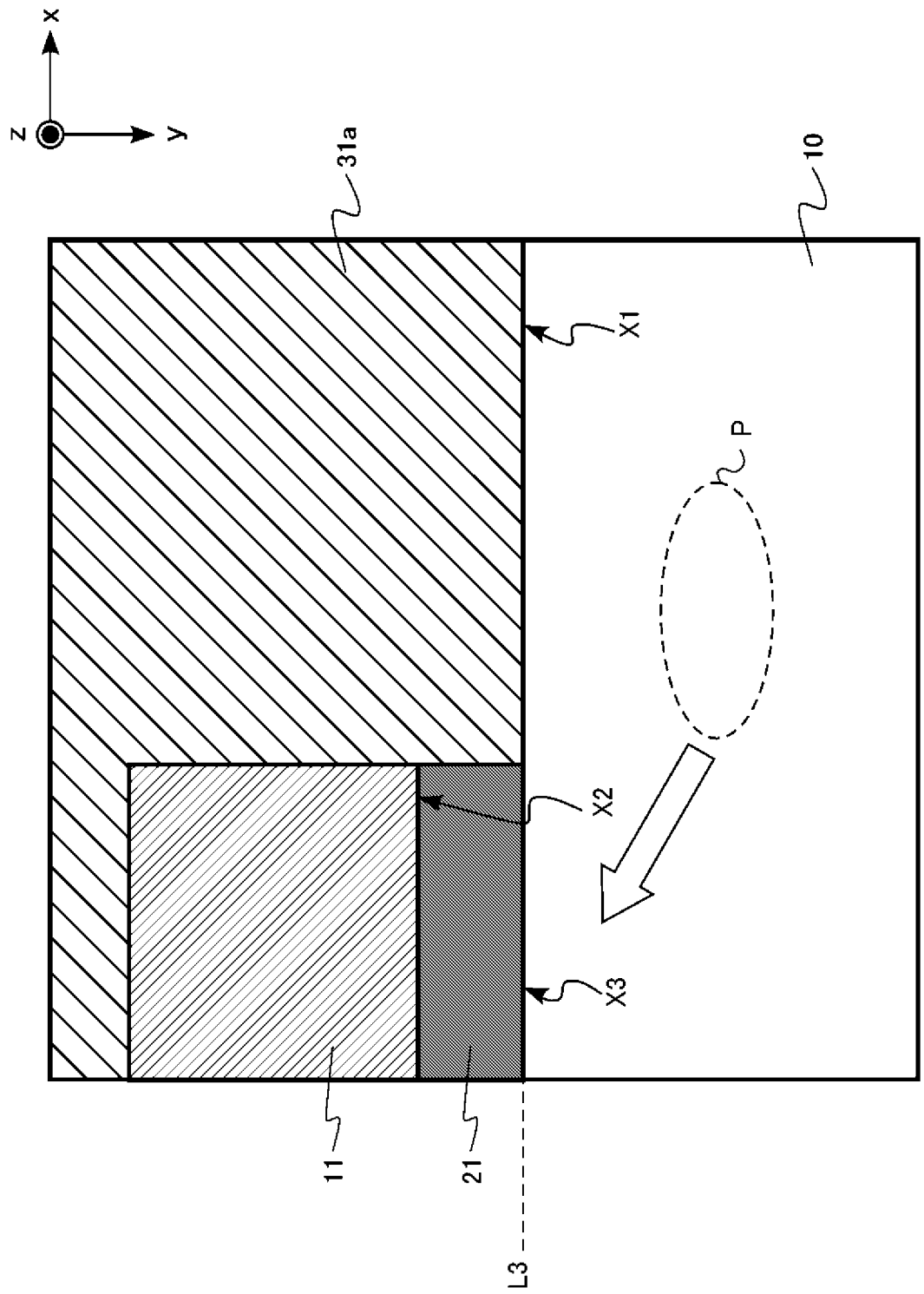
FIG. 19 is an enlarged schematic cross-sectional view of the semiconductor device of the comparative example.

FIG. 19 is an enlarged schematic cross-sectional view of the MOSFET 900. FIG. 19 illustrates a region R3 surrounded by a broken line in FIG. 18. FIG. 19 is an enlarged view of the vicinity of the end of the first gate electrode 11 in the x direction.

As illustrated in FIG. 19, an extension (L3 in FIG. 19) of the interface (X1 in FIG. 19) between the first region 31a and the semiconductor layer 10 does not intersect with the first gate electrode 11. In other words, the interface (X2 in FIG. 19) between the first gate electrode 11 and the first gate insulating layer 21 is on the side opposite to the second gate electrode 12 in the y direction with respect to the interface X1. The extension L3 of the interface X1 coincides with, for example, the interface (X3 in FIG. 19) between the semiconductor layer 10 and the first gate insulating layer 21.

When the MOSFET 900 of the comparative example is miniaturized and the gate length (Lg in FIG. 18) is shortened, a decrease in the threshold voltage due to the short channel effect is manifest. In order to miniaturize the MOSFET, it is desirable to prevent the short channel effect.

In the MOSFET 900 of the comparative example, it was found as a result of the simulation by the inventor that leak current at the end of the first gate electrode 11 on the side of the first interlayer insulating layer 31 is a main factor for the occurrence of the short channel effect. Specifically, it was found that the short-channel effect is manifest when the MOSFET 900 is turned off by a leak current path indicated by an arrow in FIG. 19 flowing from a deep position (P in FIG. 19) in the y direction of the end of the first gate electrode 11 toward the interface X3.

In the MOSFET 100, as illustrated in FIG. 2, the first gate electrode 11 is formed at a deeper position in the y direction than the interface X1. In other words, the end of the first gate electrode 11 penetrates deep into the semiconductor layer 10. With this structure, the short channel effect is further prevented as compared with the MOSFET 900. Thus, the gate length can be shorter than that of the MOSFET 900. Accordingly, the MOSFET 100 is capable of being miniaturized as compared with the MOSFET 900.

In the MOSFET 100, the control of the potential of the semiconductor layer 10 by the first gate electrode 11 is improved in the vicinity of the end of the first gate electrode 11. Therefore, the occurrence of the leak current path is prevented in the vicinity of the end of the first gate electrode 11. In particular, since the first gate electrode 11 has the protrusion 11a, the control of the potential of the semiconductor layer 10 by the first gate electrode 11 is improved, which prevents the occurrence of the leak current path.

Further, in the MOSFET 100, the width W1 in the y direction of the region of the semiconductor layer 10 sandwiched between the first gate electrode 11 and the second gate electrode 12 is smaller than the width W2 in the y direction of the region sandwiched between the first region 31a where the semiconductor layer 10 is in contact with the first interlayer insulating layer 31 and the second region 32a where the semiconductor layer 10 is in contact with the second interlayer insulating layer 32. With the smaller width W1, the control of the potential of the semiconductor layer 10 by the first gate electrode 11 and the second gate electrode 12 is improved. Thus, the short-channel effect is prevented, and the MOSFET 100 of the first embodiment is capable of being miniaturized.

The distance d between the extension L1 of the interface X1 and the interface X3 between the semiconductor layer 10 and the first gate insulating layer 21 may be 5 nm or more and 20 nm or less. When the distance d exceeds the above lower limit, the short channel effect is further prevented. Further, when the distance d is below the above upper limit, the width of the semiconductor layer 10 between the first gate electrode 11 and the second gate electrode 12 may be sufficiently secured, and a high on-current may be achieved.

The thickness of the first gate insulating layer 21 and the second gate insulating layer 22 in the y direction may be 3 nm or more and 10 nm or less. When the thickness exceeds the above lower limit, the reliability of the first gate insulating layer 21 and the second gate insulating layer 22 is improved. Further, when the thickness is below the above upper limit, the control of the potential of the semiconductor layer 10 by the first gate electrode 11 and the second gate electrode 12 is improved.

According to the above-recited embodiments, an MOSFET in which the short channel effect is prevented and miniaturization is possible can be achieved.

Second Embodiment

A semiconductor device of a second embodiment is an MOSFET 200 having a double gate structure in which gate electrodes are provided on both sides of a channel layer sandwiched therebetween. The MOSFET 200 may be applied to, for example, a select gate transistor of a three-dimensional NAND flash memory.

Figure 20:
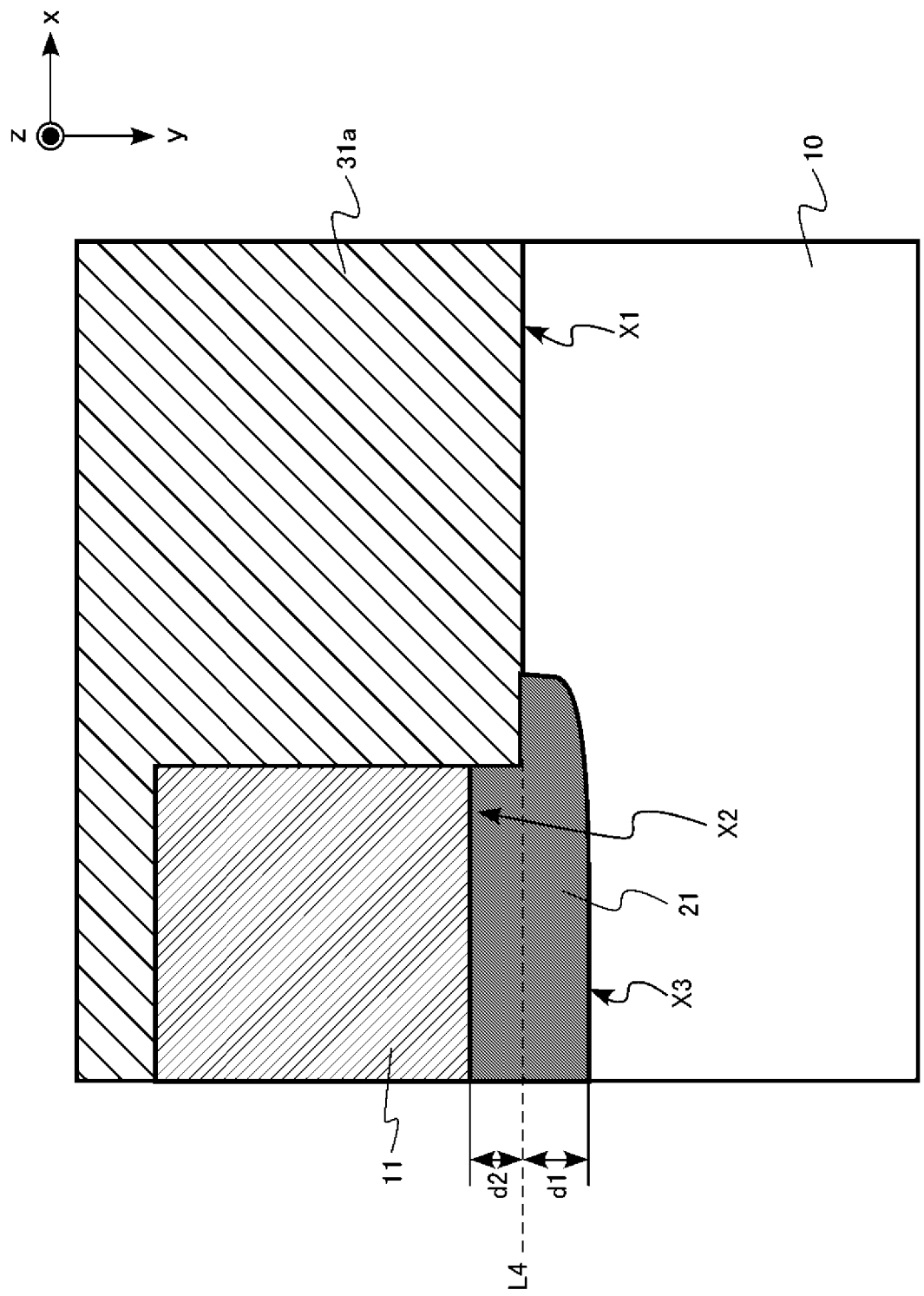
FIG. 20 is an enlarged schematic cross-sectional view of a semiconductor device of a second embodiment.

FIG. 20 is an enlarged schematic cross-sectional view of the MOSFET 200. FIG. 20 is a view corresponding to FIG. 2.

As illustrated in FIG. 20, an extension (L4 in FIG. 20) of the interface (X1 in FIG. 20) between the first region 31a and the semiconductor layer 10 intersects with the first gate insulating layer 21. The interface (X2 in FIG. 20) between the first gate electrode 11 and the first gate insulating layer 21 is on the side opposite to the second gate electrode 12 in the y direction with respect to the interface X1. Further, the interface (X3 in FIG. 20) between the semiconductor layer 10 and the first gate insulating layer 21 is on the side of the second gate electrode 12 in the y direction with respect to the interface X1.

The distance d1 shown in FIG. 20 between the extension L4 and the interface X3 between the semiconductor layer 10 and the first gate insulating layer 21 is greater than the distance d2 shown in FIG. 20 between the extension L4 and the interface X2 between the first gate insulating layer 21 and the first gate electrode 11.

In the MOSFET 200, as illustrated in FIG. 20, the first gate insulating layer 21 is formed at a deeper position in the y direction than the interface X1. In other words, the end of the first gate insulating layer 21 penetrates deep into the semiconductor layer 10. With this structure, the short channel effect is further prevented as compared with the MOSFET 900 of the comparative example. Thus, the gate length may be shorter than that of the MOSFET 900 of the comparative example. Accordingly, the MOSFET 200 o is capable of being miniaturized as compared with the MOSFET 900.

In the MOSFET 200, the control of the potential of the semiconductor layer 10 by the first gate electrode 11 is improved in the vicinity of the end of the first gate electrode 11. Therefore, the occurrence of the leak current path is prevented in the vicinity of the end of the first gate electrode 11.

According to the above-described embodiments, an MOSFET in which the short channel effect is prevented and miniaturization is possible can be achieved.

Third Embodiment

A semiconductor device of a third embodiment is a three-dimensional NAND flash memory 300 in which a plurality of semiconductor layers extending along a direction parallel to the surface of a semiconductor substrate are stacked on the semiconductor substrate with an insulating layer sandwiched therebetween. A memory cell is formed at the intersection of a control electrode layer extending along a direction perpendicular to the surface of the semiconductor substrate and the semiconductor layer.

Figure 21:
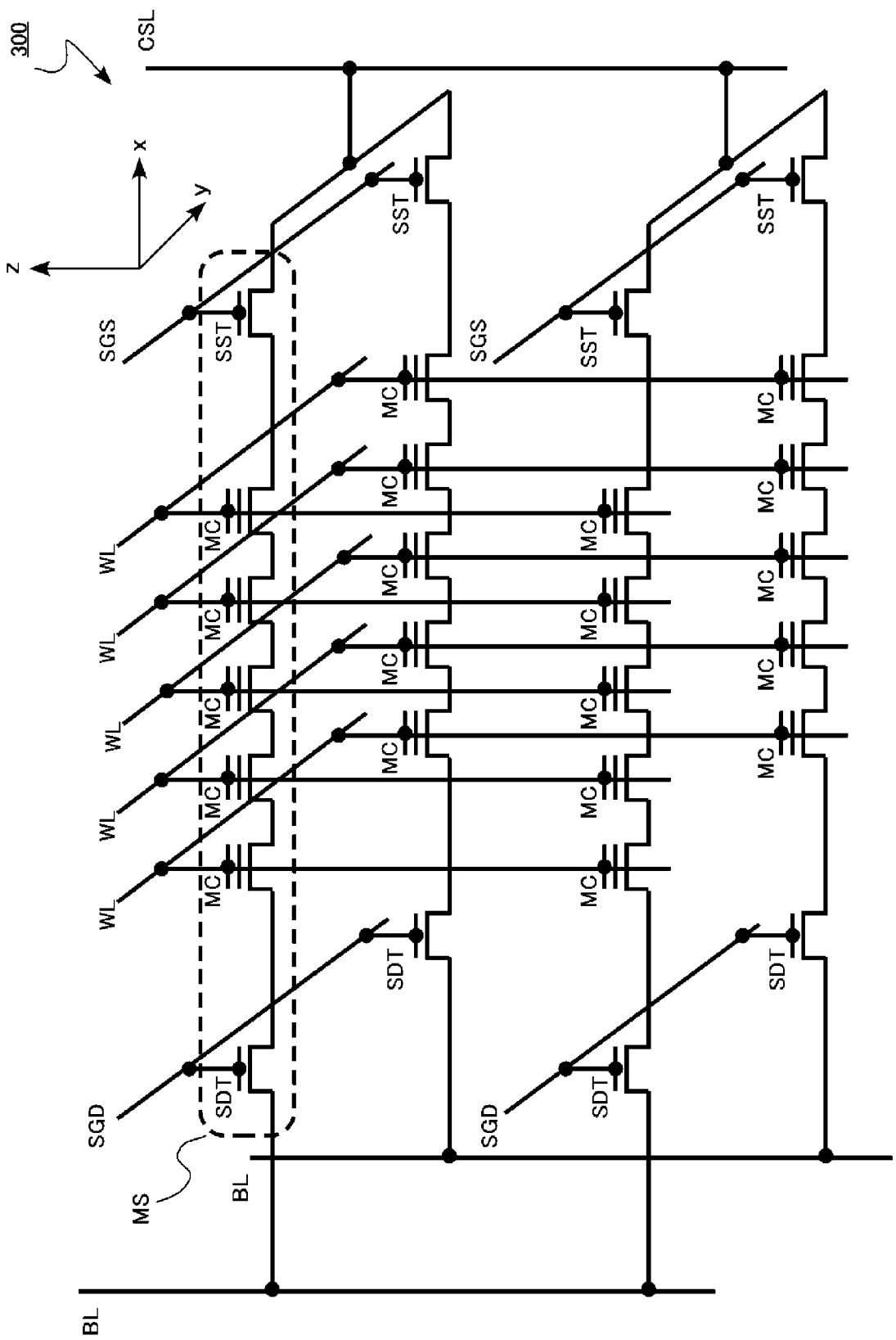
FIG. 21 is an equivalent circuit diagram of a memory cell array of a semiconductor storage device of a third embodiment.

FIG. 21 is an equivalent circuit diagram of a memory cell array of the flash memory 300. The flash memory 300 has a plurality of word lines WL, a common source line CSL, a plurality of source select gate lines SGS, a plurality of drain select gate lines SGD, a plurality of bit lines BL, and a plurality of memory strings MS.

The word lines WL extend along the y direction and are spaced apart from each other in the x direction. The plurality of memory strings MS extend along the x direction. The plurality of bit lines BL extend along, for example, the z direction.

As illustrated in FIG. 21, the memory string MS includes a source select gate transistor SST, a plurality of memory cells MC, and a drain select gate transistor SDT which are connected in series between the common source line CSL and the bit line BL. One memory string MS may be selected by selecting one bit line BL and one drain select gate line SGD, and one memory cell MC therein may be selected by selecting one word line WL.

In the flash memory 300, the drain select gate transistor SDT has the same structure as that of the MOSFET 100.

FIG. 21 illustrates an example where the number of memory cells MC in each memory string MS is five and the number of memory strings MS is four, but the numbers of memory strings MS and memory cells MC are not limited to that example.

The flash memory 300 includes, for example, a peripheral circuit. The peripheral circuit is implemented by, for example, a CMOS circuit and has a function of controlling an operation of the memory cell array.

FIG. 22 through FIG. 25 are schematic cross-sectional views of the memory cell array of the flash memory 300. FIG. through FIG. 25 include the cross-sections of the plurality of memory cells and the drain select gate transistor SDT in the memory cell array of FIG. 21, for example, in one memory string MS surrounded by a dotted line.

Figure 22:
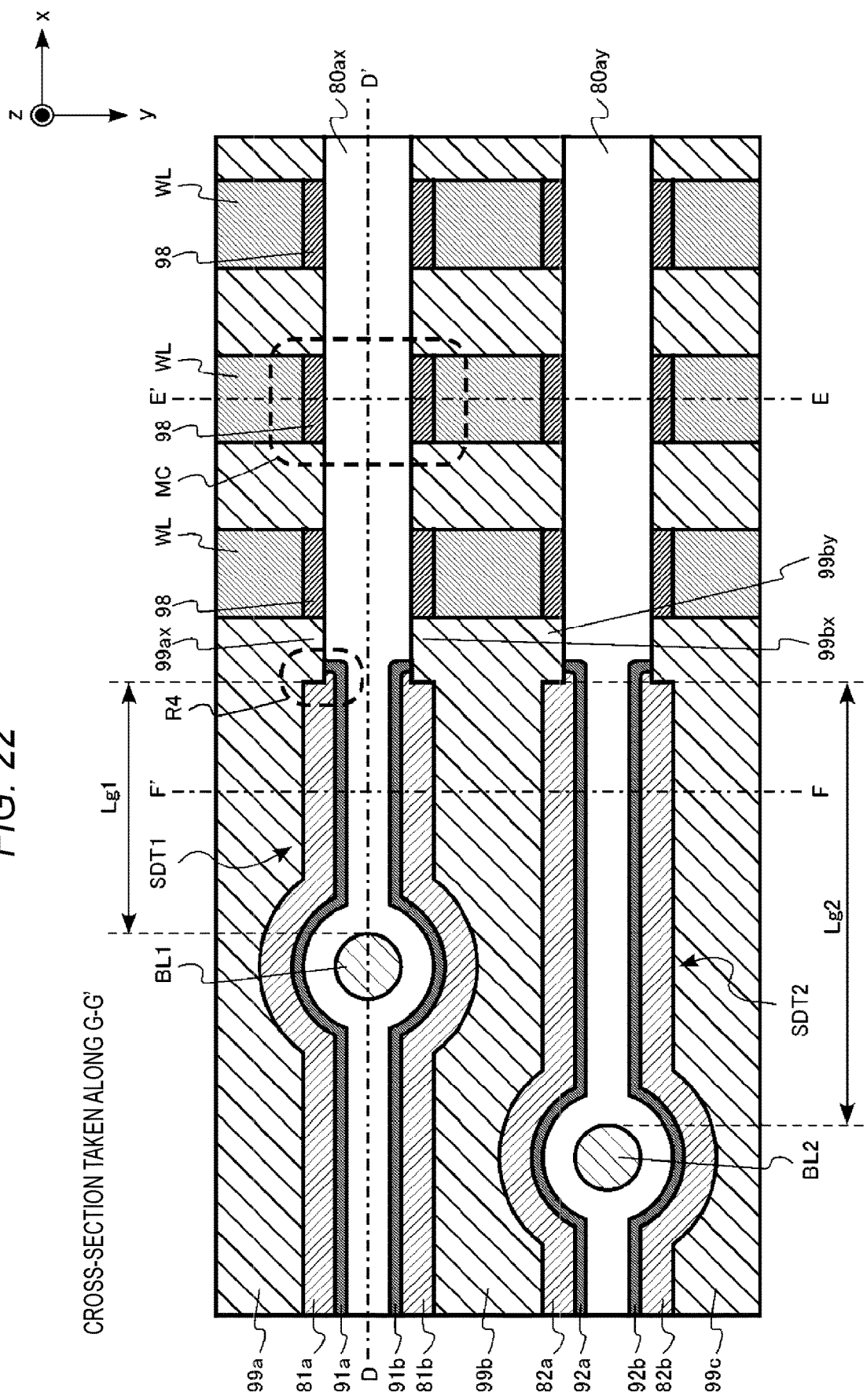
FIG. 22 is a schematic cross-sectional view of a memory cell array of a semiconductor storage device of a third embodiment.
Figure 23:
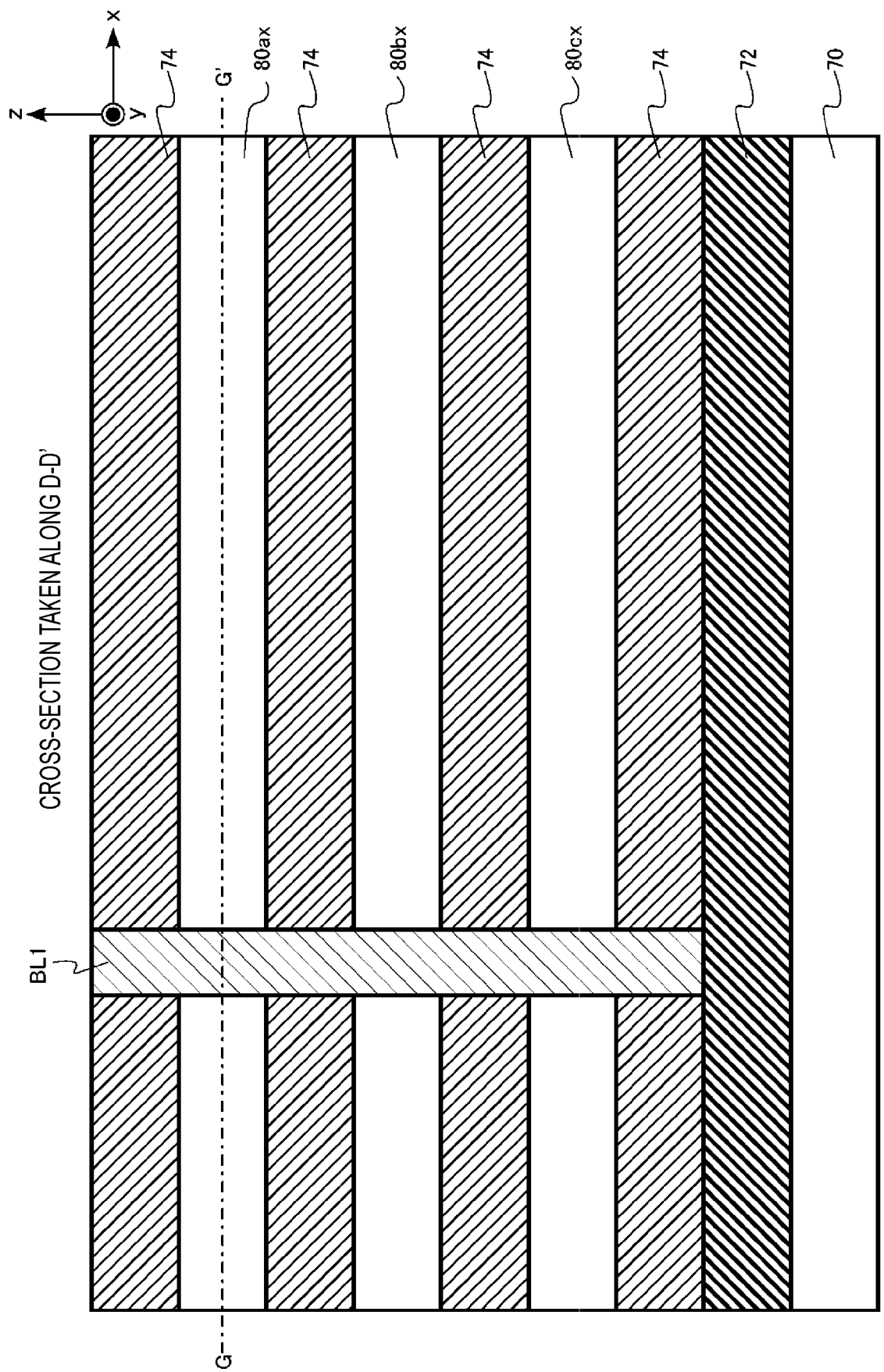
FIG. 23 is a schematic cross-sectional view of a memory cell array of a semiconductor storage device of a third embodiment.
Figure 24:
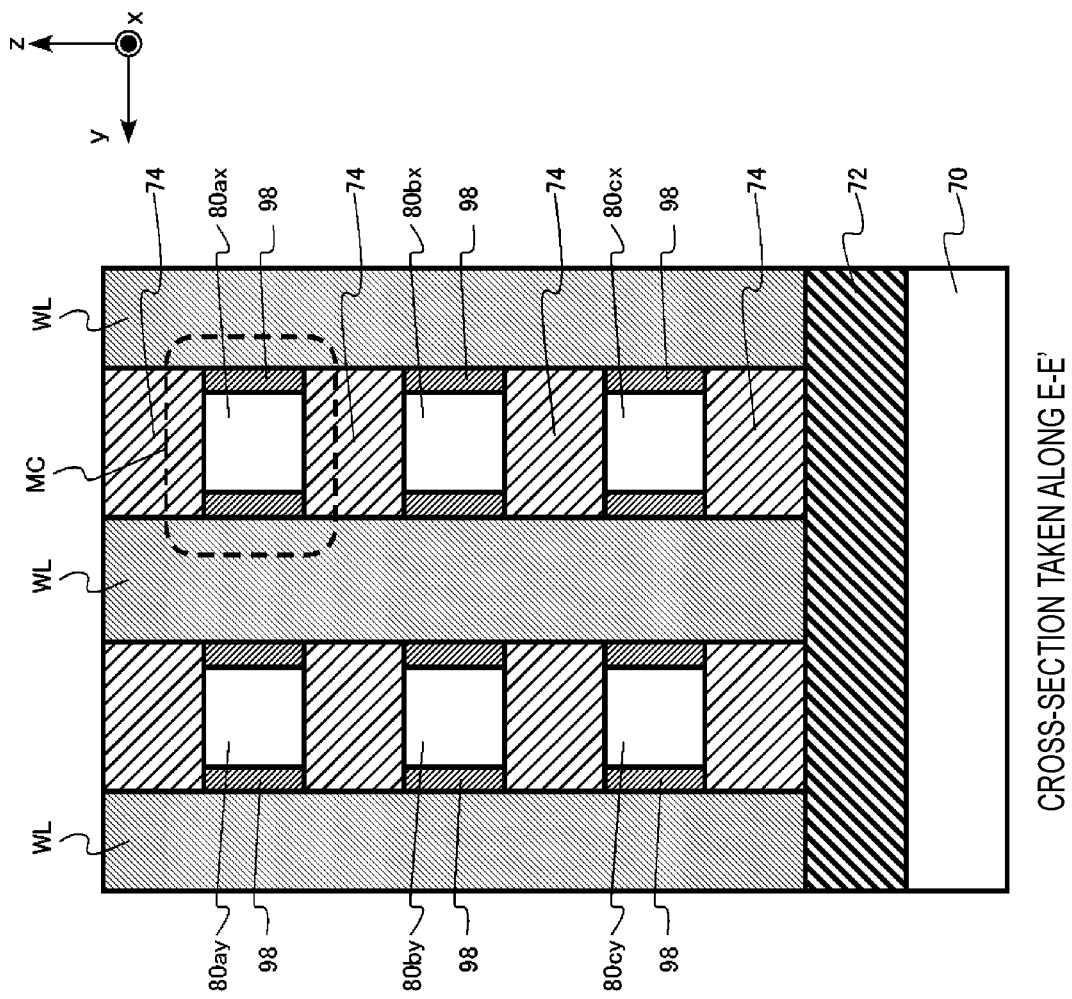
FIG. 24 is a schematic cross-sectional view of a memory cell array of a semiconductor storage device of a third embodiment.
Figure 25:
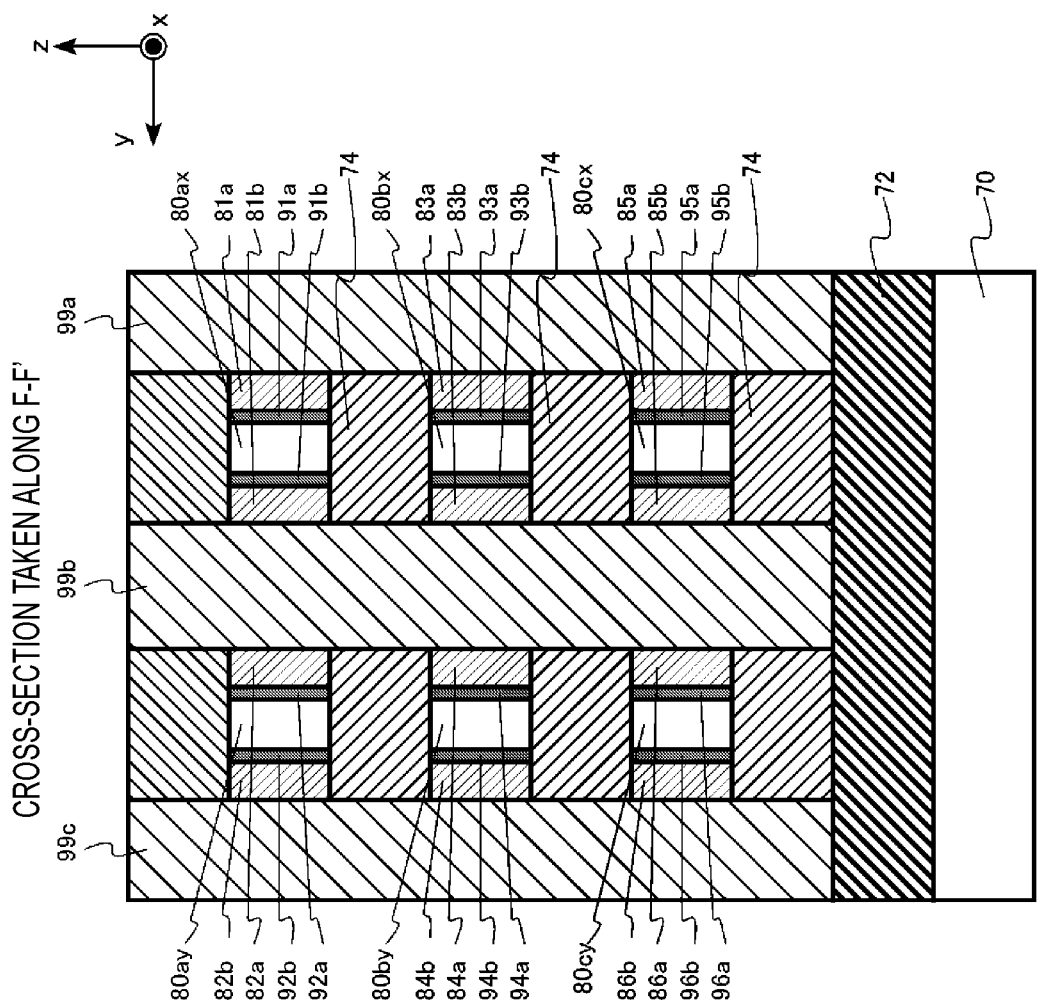
FIG. 25 is a schematic cross-sectional view of a memory cell array of a semiconductor storage device of a third embodiment.

FIG. 22 is the cross-section taken along G-G' of FIG. 23. FIG. 23 is the cross-section taken along D-D' of FIG. 22. FIG. 24 is the cross-section taken along E-E' of FIG. 22. FIG. 25 is the cross-section taken along F-F' of FIG. 22.

FIG. 22 is an xy cross-sectional view of the memory cell array of the flash memory 300. FIG. 23 is an xz cross-sectional view of the memory cell array. FIG. 24 is an yz cross-sectional view of the memory cell array. FIG. 25 is an yz cross-sectional view of the memory cell array. In FIGS. 22 and 24, the region surrounded by a broken line is one memory cell.

As shown in FIG. 22 through FIG. 24, the flash memory 300 includes a semiconductor substrate 70, a substrate insulating layer 72, an isolation insulating layer 74, a channel layer 80ax, a channel layer 80ay, a channel layer 80bx, a channel layer 80by, a channel layer 80cx, a channel layer 80cy, a first select gate electrode 81a, a first select gate electrode 81b, a second select gate electrode 82a, a second select gate electrode 82b, a third select gate electrode 83a, a third select gate electrode 83b, a fourth select gate electrode 84a, a fourth select gate electrode 84b, a fifth select gate electrode 85a, a fifth select gate electrode 85b, a sixth select gate electrode 86a, a sixth select gate electrode 86b, a first select gate insulating layer 91a, a first select gate insulating layer 91b, a second select gate insulating layer 92a, a second select gate insulating layer 92b, a third select gate insulating layer 93a, a third select gate insulating layer 93b, a fourth select gate insulating layer 94a, a fourth select gate insulating layer 94b, a fifth select gate insulating layer 95a, a fifth select gate insulating layer 95b, a sixth select gate insulating layer 96a, a sixth select gate insulating layer 96b, a charge storage layer 98, a first interlayer insulating layer 99a, a second interlayer insulating layer 99b, a third interlayer insulating layer 99c, a word line WL, a first bit line BL1, and a second bit line BL2.

Hereinafter, for simplicity of description, the channel layer 80ax, the channel layer 80ay, the channel layer 80bx, the channel layer 80by, the channel layer 80cx, and the channel layer 80cy may each collectively be referred to as a channel layer 80.

The semiconductor substrate 70 is, for example, single crystal silicon. The semiconductor substrate 70 is, for example, a silicon substrate. The semiconductor substrate has surfaces parallel to the x direction and the y direction. The direction perpendicular to the surface of the semiconductor substrate 70 is the z direction.

The substrate insulating layer 72 is provided on the semiconductor substrate 70. The substrate insulating layer 72 is, for example, an oxide, a nitride, or an oxynitride. The substrate insulating layer 72 comprises, for example, silicon oxide. The substrate insulating layer 72 is, for example, a silicon oxide layer.

The isolation insulating layer 74 and the channel layer 80 are alternately stacked on the substrate insulating layer 72.

The isolation insulating layer 74 is, for example, an oxide, a nitride, or an oxynitride. The interlayer insulating layer 16 comprises, for example, silicon oxide. The isolation insulating layer 74 is, for example, a silicon oxide layer. The isolation insulating layer 74 has a function of electrically isolating adjacent channel layers 80 from each other.

The channel layer 80 extends along the x direction. The channel layer 80 functions as a channel of a transistor of the memory cell MC. Further, the channel layer 80 also functions as a channel of the drain select gate transistor SDT.

The channel layer 80 is, for example, a polycrystalline semiconductor. The channel layer 80 comprises, for example, polycrystalline silicon. The channel layer 80 is, for example, a polycrystalline silicon layer.

The channel layer 80 is, for example, p-type polycrystalline silicon containing a p-type impurity. The p-type impurity is, for example, boron (B). The concentration of the p-type impurity of the channel layer 80 is, for example, $1 \times 10^{17}$ cm$^3$ or more and $5 \times 10^{18}$ cm$^3$ or less.

The word line WL extends along the z direction perpendicular to the surface of the semiconductor substrate 70. The word line WL functions as a control electrode layer of the transistor of the memory cell MC.

The word line WL is a columnar-type conductor. The word line WL is, for example, a metal. The word line WL includes, for example, tungsten (W). The word line WL is, for example, a tungsten layer.

The first interlayer insulating layer 99a, the second interlayer insulating layer 99b, and the third interlayer insulating layer 99c are provided between the channel layers 80. The first interlayer insulating layer 99a, the second interlayer insulating layer 99b, and the third interlayer insulating layer 99c are provided between the word lines WL.

The first interlayer insulating layer 99a, the second interlayer insulating layer 99b, and the third interlayer insulating layer 99c are, for example, an oxide, a nitride, or an oxynitride. The first interlayer insulating layer 99a, the second interlayer insulating layer 99b, and the third interlayer insulating layer 99c comprise, for example, silicon oxide. The first interlayer insulating layer 99a, the second interlayer insulating layer 99b, and the third interlayer insulating layer 99c are, for example, silicon oxide layers.

The charge storage layer 98 is provided between the word line WL and the channel layer 80.

The charge storage layer 98 has a function of storing charges. The charges are, for example, electrons. The threshold voltage of the memory cell transistor changes according to the amount of charges stored in the charge storage layer 98. By utilizing this change in the threshold voltage, one memory cell MC is capable of storing data. As the amount of charges stored in the charge storage layer 98 increases, the amount of change in the threshold voltage increases.

When the threshold voltage of the memory cell transistor changes, the voltage at which the memory cell transistor is turned on changes. For example, when a state where the threshold voltage is high is defined as data "0" and a state where the threshold voltage is low is defined as data "1", the memory cell MC may store 1-bit data of "0" and "1".

The charge storage layer 98 has, for example, a stacked structure of a tunnel insulating film, a charge storage film, and a block insulating film. The tunnel insulating film is, for example, a silicon oxide film. The charge storage film is, for example, a polycrystalline silicon film. The block insulating film is, for example, a silicon oxide film.

The first select gate electrode 81a, the first select gate electrode 81b, the second select gate electrode 82a, the second select gate electrode 82b, the third select gate electrode 83a, the third select gate electrode 83b, the fourth select gate electrode 84a, the fourth select gate electrode 84b, the fifth select gate electrode 85a, the fifth select gate electrode 85b, the sixth select gate electrode 86a, and the sixth select gate electrode 86b are conductors.

Each of the first select gate electrode 81a, the first select gate electrode 81b, the second select gate electrode 82a, the second select gate electrode 82b, the third select gate electrode 83a, the third select gate electrode 83b, the fourth select gate electrode 84a, the fourth select gate electrode 84b, the fifth select gate electrode 85a, the fifth select gate electrode 85b, the sixth select gate electrode 86a, and the sixth select gate electrode 86b functions as a gate electrode of the drain select gate transistor SDT.

Each of the first select gate insulating layer 91a, the first select gate insulating layer 91b, the second select gate insulating layer 92a, the second select gate insulating layer 92b, the third select gate insulating layer 93a, the third select gate insulating layer 93b, the fourth select gate insulating layer 94a, the fourth select gate insulating layer 94b, the fifth select gate insulating layer 95a, the fifth select gate insulating layer 95b, the sixth select gate insulating layer 96a, and the sixth select gate insulating layer 96b functions as a gate insulating layer of the drain select gate transistor SDT.

The first select gate electrode 81a and the first select gate electrode 81b are conductors. The first select gate electrode 81a and the first select gate electrode 81b function as a gate electrode of a first drain select gate transistor SDT1.

The first select gate electrode 81a and the first select gate electrode 81b include, for example, polycrystalline silicon. The first select gate electrode 81a and the first select gate electrode 81b are, for example, p-type polycrystalline silicon containing a p-type impurity. The p-type impurity is, for example, boron (B). The first select gate electrode 81a and the first select gate electrode 81b are, for example, n-type polycrystalline silicon containing an n-type impurity. The n-type impurity is, for example, arsenic (As) or phosphorus (P).

The first select gate electrode 81a and the first select gate electrode 81b are electrically connected to each other.

The channel layer 80ax is provided between the first select gate electrode 81a and the first select gate electrode 81b.

The first select gate insulating layer 91a is provided between the first select gate electrode 81a and the channel layer 80ax. The first select gate insulating layer 91b is provided between the first select gate electrode 81b and the channel layer 80ax.

The first interlayer insulating layer 99a has a first region 99ax. The first region 99ax and the first select gate electrode 81a are provided along the x direction. The first region 99ax is provided on the +x side of the first select gate electrode 81a. The first region 99ax is in contact with the channel layer 80ax.

The second interlayer insulating layer 99b has a second region 99bx. The second region 99bx and the first select gate electrode 81b are provided along the x direction. The second region 99bx is provided on the +x side of the first select gate electrode 81b. The second region 99bx is in contact with the channel layer 80ax. The channel layer 80ax is provided between the first region 99ax and the second region 99bx.

One of the word lines WL is provided on the +x side of the first select gate electrode 81a. The first interlayer insulating layer 99a is provided between the word line WL and the first select gate electrode 81a. The charge storage layer 98 is provided between one of the word lines WL and the channel layer 80ax.

The first bit line BL1 is provided between the first select gate insulating layer 91a and the first select gate insulating layer 91b. The first bit line BL1 is electrically connected to the channel layer 80ax. The first bit line BL1 extends along the z direction.

The second select gate electrode 82a and the second select gate electrode 82b are conductors. The second select gate electrode 82a and the second select gate electrode 82b function as gate electrodes of a second drain select gate transistor SDT2.

The second select gate electrode 82a and the second select gate electrode 82b comprise, for example, polycrystalline silicon. The second select gate electrode 82a and the second select gate electrode 82b are, for example, p-type polycrystalline silicon containing a p-type impurity. The p-type impurity is, for example, boron (B). The second select gate electrode 82a and the second select gate electrode 82b are, for example, n-type polycrystalline silicon containing an n-type impurity. The n-type impurity is, for example, arsenic (As) or phosphorus (P).

The second select gate electrode 82a and the second select gate electrode 82b are electrically connected to each other.

The channel layer 80ay is provided between the second select gate electrode 82a and the second select gate electrode 82b. The channel layer 80ay extends along the x direction. The second interlayer insulating layer 99b is provided between the channel layer 80ay and the channel layer 80ax.

The second select gate insulating layer 92a is provided between the second select gate electrode 82a and the channel layer 80ay. The second select gate insulating layer 92b is provided between the second select gate electrode 82b and the channel layer 80ay.

The second interlayer insulating layer 99b has a third region 99by. The third region 99by and the second select gate electrode 82a are provided along the first direction. The third region 99by is provided on the +x side of the second select gate electrode 82a. The third region 99by is in contact with the channel layer 80ay.

A part of the third interlayer insulating layer 99c is provided on the +x side of the second select gate electrode 82b. A part of the third interlayer insulating layer 99c is in contact with the channel layer 80ay. The channel layer 80ay is provided between the third region 99by and a part of the third interlayer insulating layer 99c.

One of the word lines WL is provided on the +x side of the second select gate electrode 82a. The second interlayer insulating layer 99b is provided between the word line WL and the second select gate electrode 82a. The charge storage layer 98 is provided between one of the word lines WL and the channel layer 80ay.

The second bit line BL2 is provided between the second select gate insulating layer 92a and the second select gate insulating layer 92b. The second bit line BL2 is electrically connected to the channel layer 80ay. The second bit line BL2 extends along the z direction.

The distance Lg1 shown in FIG. 22 in the x direction between the first bit line BL1 and the end of the first select gate electrode 81a on the side of the first region 99ax is smaller than the distance Lg2 shown in FIG. 22 in the x direction between the second bit line BL2 and the end of the second select gate electrode 82a on the side of the third region 99by. In other words, the gate length Lg1 of the first drain select gate transistor SDT1 controlled by the first select gate electrode 81a and the first select gate electrode 81b is shorter than the gate length Lg2 of the second drain select gate transistor SDT2 controlled by the second select gate electrode 82a and the second select gate electrode 82b.

Figure 26:
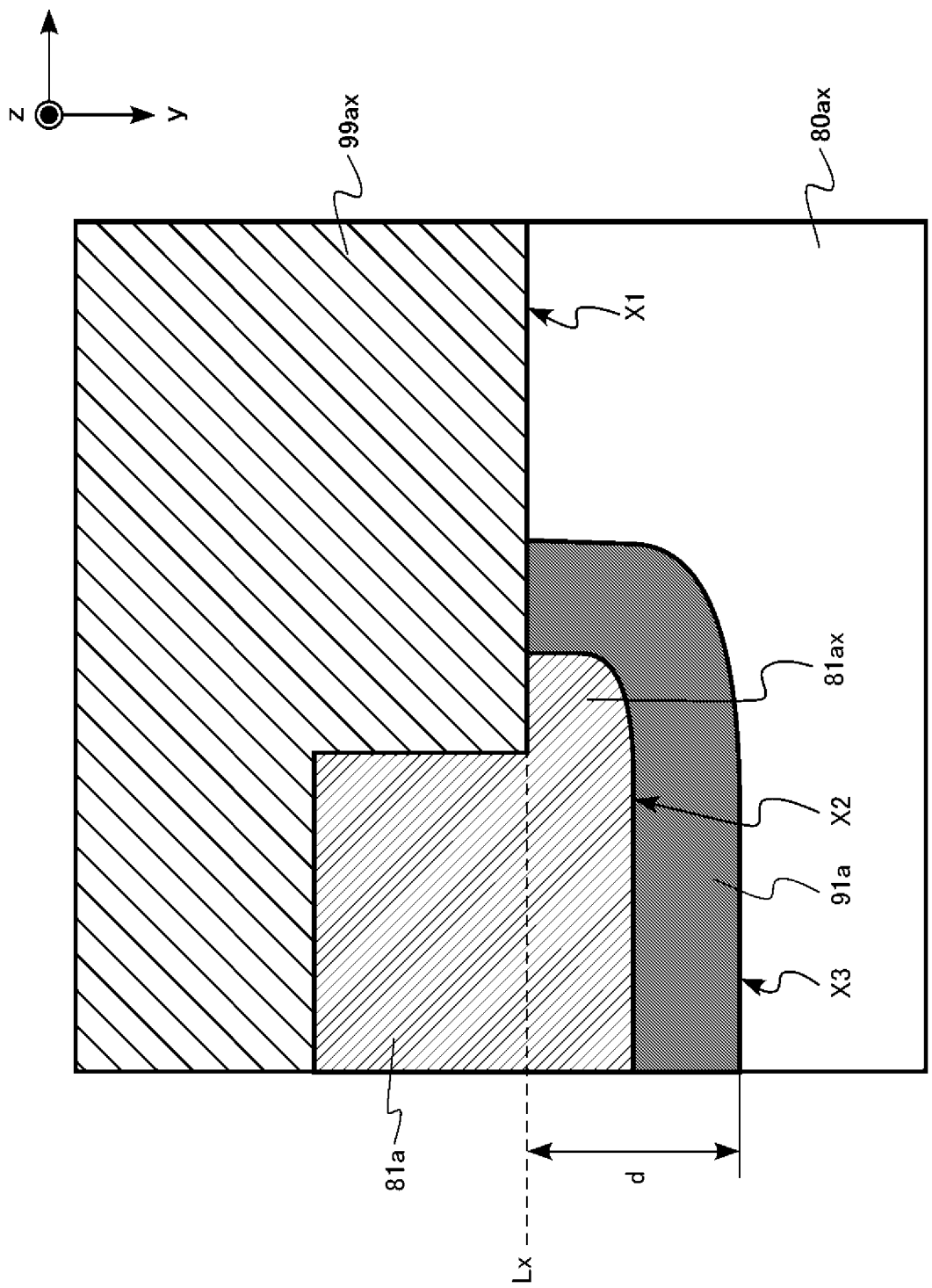
FIG. 26 is an enlarged schematic cross-sectional view of a semiconductor storage device of a third embodiment.

FIG. 26 is an enlarged schematic cross-sectional view of the flash memory 300. FIG. 26 illustrates a region R4 surrounded by a broken line in FIG. 22. FIG. 26 is an enlarged view of the vicinity of the end of the first select gate electrode 81a in the x direction.

As illustrated in FIG. 26, an extension Lx of an interface X1 between the first region 99ax of the first interlayer insulating layer 99a and the channel layer 80ax intersects with the first select gate electrode 81a. In other words, an interface X2 between the first select gate electrode 81a and the first select gate insulating layer 91a is on the side of the first select gate electrode 81b in the y direction with respect to the interface X1.

The distance d shown in FIG. 26 between the extension Lx of the interface X1 and an interface X3 between the channel layer 80ax and the first select gate insulating layer 91a is, for example, 5 nm or more and 20 nm or less.

The first select gate electrode 81a has a protrusion 81ax extending along the x direction on the side of the channel layer 80ax at the end thereof on the side of the first interlayer insulating layer 99a. The protrusion 81ax is on the side of the first select gate electrode 81b in the y direction with respect to the extension Lx of the interface X1.

The first drain select gate transistor SDT1 and the second drain select gate transistor SDT2 have the same configuration as the MOSFET 100. Therefore, the short channel effect of the first drain select gate transistor SDT1 and the second drain select gate transistor SDT2 is prevented. Thus, it is possible to prevent that the threshold voltage between the first drain select gate transistor SDT1 and the second drain select gate transistor SDT2 having different gate lengths are different. Accordingly, an operation of the flash memory 100 is stabilized.

Further, by preventing the short channel effect, the gate length of the drain select gate transistor SDT may be shortened. Thus, the drain select gate transistor SDT may be miniaturized. Since the drain select gate transistor SDT may be miniaturized, the flash memory 300 may be miniaturized.

As described above, according to the above-described embodiments, a flash memory in which the short channel effect is prevented, an operation is stable, and miniaturization is possible can be achieved.

In the above-describe embodiments, the configuration same as the MOSFET 100 is applied to the drain select gate transistor SDT. However, such a configuration may also be applied to the source select gate transistor SST.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first gate electrode;
a second gate electrode;
a semiconductor layer between the first and second gate electrodes and extending along a first direction;
a first gate insulating layer between the first gate electrode and the semiconductor layer;
a second gate insulating layer between the second gate electrode and the semiconductor layer;
a first insulating layer including a first region that is adjacent to the first gate electrode in the first direction and contacts the semiconductor layer; and
a second insulating layer including a second region that is adjacent to the second gate electrode in the first direction and contacts the semiconductor layer, wherein
a first interface between the first region and the semiconductor layer in a second direction crossing the first direction is located adjacent to the first gate electrode in the first direction.

2. The semiconductor device according to claim 1, wherein the first gate electrode has a protrusion protruding towards the first direction along the first interface.

3. The semiconductor device according to claim 1, further comprising:
a first electrode between the first and second gate insulating layers and electrically connected to the semiconductor layer; and
a second electrode electrically connected to the semiconductor layer and located farther from the first electrode than the first region in the first direction.

4. The semiconductor device according to claim 1, further comprising:
a third gate electrode adjacent to the first region of the first insulating layer in the first direction; and
a third gate insulating layer between the third gate electrode and the semiconductor layer.

5. The semiconductor device according to claim 1, wherein a distance between the first interface and a second interface between the semiconductor layer and the first gate insulating layer in the second direction is 5 nm or more and 20 nm or less.

6. The semiconductor device according to claim 1, wherein a thickness of the first gate insulating layer is 3 nm or more and 10 nm or less.

7. The semiconductor device according to claim 1, wherein a third interface between the second region and the semiconductor layer in the second direction is located adjacent to the second gate electrode in the first direction.

8. The semiconductor device according to claim 1, wherein the first and second gate electrodes are electrically connected to each other.

9. The semiconductor device according to claim 1, wherein the semiconductor layer is polycrystalline silicon.

\* \* \* \* \*